(12) United States Patent
Bultitude et al.

(10) Patent No.: US 10,950,688 B2
(45) Date of Patent: Mar. 16, 2021

(54) PACKAGES FOR POWER MODULES WITH INTEGRATED PASSIVES

(71) Applicant: KEMET Electronics Corporation, Fort Lauderdale, FL (US)

(72) Inventors: John Bultitude, Simpsonville, SC (US); Lonnie G. Jones, Simpsonville, SC (US); Allen Templeton, Simpsonville, SC (US); Philip M. Lessner, Simpsonville, SC (US)

(73) Assignee: KEMET Electronics Corporation, Fort Lauderdale, FL (US)

( * ) Notice: Subject to any disclaimer, the term of this patent is extended or adjusted under 35 U.S.C. 154(b) by 15 days.

(21) Appl. No.: 16/531,255

(22) Filed: Aug. 5, 2019

(65) Prior Publication Data
US 2020/0273949 A1 Aug. 27, 2020

Related U.S. Application Data

(60) Provisional application No. 62/808,493, filed on Feb. 21, 2019.

(51) Int. Cl.
*H01L 49/02* (2006.01)
*H01L 23/522* (2006.01)
*H01L 23/48* (2006.01)

(52) U.S. Cl.
CPC .......... *H01L 28/65* (2013.01); *H01L 23/481* (2013.01); *H01L 23/5223* (2013.01)

(58) Field of Classification Search
CPC ..... H01G 4/00; H01L 23/481; H01L 23/5223; H01L 23/65
See application file for complete search history.

(56) References Cited

U.S. PATENT DOCUMENTS

| | | | |
|---|---|---|---|
| 3,503,809 | A | 3/1970 | Spacil |
| 5,545,184 | A | 8/1996 | Dougherty |
| 5,841,645 | A | 11/1998 | Shinji |
| 6,251,816 | B1 | 6/2001 | Maher et al. |
| 7,339,798 | B2 | 3/2008 | Chakravorty |
| 8,368,175 | B2 | 2/2013 | Nakagawa et al. |
| 8,471,381 | B2 | 6/2013 | Owyang et al. |
| 8,885,324 | B2 | 11/2014 | Bultitude et al. |
| 9,077,335 | B2 | 7/2015 | Hughes et al. |
| 9,589,868 | B2 | 3/2017 | McKnight-MacNeil et al. |

(Continued)

FOREIGN PATENT DOCUMENTS

| | | |
|---|---|---|
| DE | 102004063560 | 1/2009 |
| WO | WO 1995/034914 | 12/1995 |
| WO | WO 2016/054102 | 4/2016 |

OTHER PUBLICATIONS

ISA/US; International Search Report and Written Opinion of the International Searching Authority; PCT/US2020/017917; dated May 7, 2020.

*Primary Examiner* — Allan R Wilson
(74) *Attorney, Agent, or Firm* — Joseph T. Guy; Patent Filing Specialist Inc.

(57) ABSTRACT

Provided herein is a module for packaging semiconductors comprising: at least one PDC comprising parallel internal electrodes of alternating polarity with a paraelectric dielectric between adjacent internal electrodes wherein the paraelectric dielectric has a permittivity above 10 to no more than 300; and wherein the PDC forms a capacitor couple with at least one semiconductor.

33 Claims, 20 Drawing Sheets

(56) References Cited

U.S. PATENT DOCUMENTS

| | | |
|---|---|---|
| 9,748,272 B2 | 8/2017 | Nygaard et al. |
| 2004/0135189 A1* | 7/2004 | Kiyotoshi ............ H01L 27/0688 257/306 |
| 2006/0133011 A1 | 6/2006 | Cox |
| 2008/0258259 A1* | 10/2008 | Osaka ..................... H01L 24/73 257/532 |
| 2010/0052099 A1* | 3/2010 | Chang ..................... H01L 28/91 257/535 |
| 2011/0018100 A1* | 1/2011 | Nakagawa ........ H01L 21/02271 257/532 |
| 2011/0163452 A1* | 7/2011 | Horii ....................... C23C 16/06 257/758 |
| 2011/0316119 A1 | 12/2011 | Kim et al. |
| 2014/0035114 A1 | 2/2014 | Gogoi et al. |
| 2014/0160624 A1 | 6/2014 | McConnell et al. |
| 2015/0016015 A1 | 1/2015 | Lee et al. |
| 2015/0262904 A1 | 9/2015 | Wensen et al. |
| 2016/0104584 A1 | 4/2016 | Weirong et al. |
| 2018/0226339 A1* | 8/2018 | Kim ........................ H01L 22/14 |
| 2019/0165776 A1 | 5/2019 | Hughes et al. |

\* cited by examiner

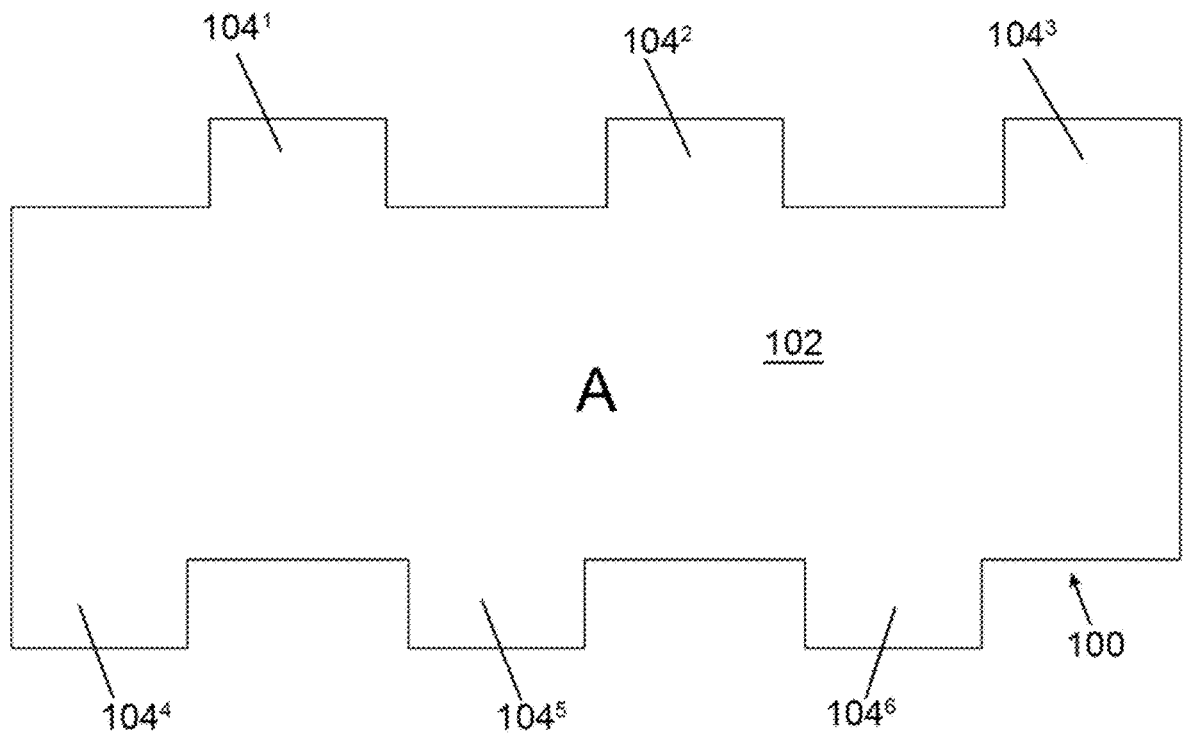
Fig. 5
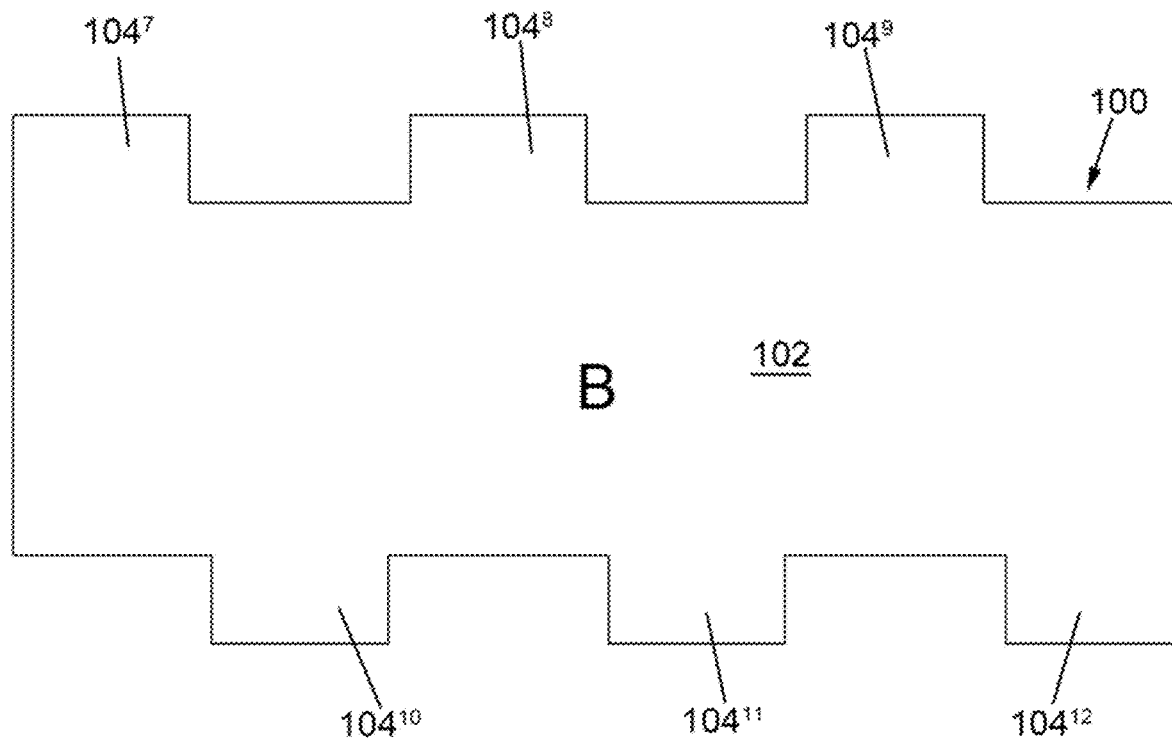

PACKAGES FOR POWER MODULES WITH INTEGRATED PASSIVES

CROSS-REFERENCE TO RELATED APPLICATIONS

The present invention claims priority to U.S. Provisional Pat. Appl. No. 62/808,493 filed Feb. 21, 2019 which is incorporated herein by reference.

FIELD OF THE INVENTION

The present invention is related to packages for power modules comprising integrated passive components. More specifically, the present invention is related to packages for power modules comprising capacitance integral to the module thereby minimizing the necessity for the incorporation of individual capacitors as mounted components.

BACKGROUND

There is an on-going need to reduce the size of electronics. This effort, referred to in the art as miniaturization, manifest in two primary ways. One primary focus is at the component level wherein each component is continually scrutinized for areas of inefficiency, in structure or functionality, with a goal of achieving a higher level of functionality in a smaller volume. The other primary focus is at the module, or electronic device, level wherein assemblies of electronic components are taken together to from a functional module or a functional device. The present invention is specifically related to miniaturization of a module, particularly a power module.

The efforts related to miniaturization of power modules has led to the use of wide band gap semiconductors, such as those based on SiC and GaN, which operate at higher switching frequencies and higher voltages. At higher switching frequencies less capacitance is required so the space occupied by capacitors is reduced. The amount of capacitance required for a DC-LINK capacitor, for example, at a given frequency in Hz can be calculated using Equation 1:

$$C = \frac{P_{load}}{U_{ripple}\left(U_{max} - \frac{U_{ripple}}{2}\right)2*\pi*f} \qquad \text{Equation 1}$$

where:
C=Capacitance (F);
$P_{load}$=Power (W);
$U_{ripple}$=Ripple Voltage (V)
$U_{max}$=Maximum Voltage (V); and
f=Switching Frequency (Hz)

Using Equation 1, it is possible to estimate the capacitance required for a given power load as shown in FIGS. 1 and 2. As can be seen in FIGS. 1 and 2 increasing the voltage further reduces the capacitance needed but higher capacitances are required as power load increases. Increasing the switching frequency also reduces the capacitance required for snubber capacitors. Lower capacitance values are desirable for size reduction but at higher frequencies electromagnetic interference (EMI) becomes an issue.

At low frequencies, high power and lower voltage very large DC-Link capacitors are required as illustrated in FIGS. 1 and 2. At switching frequencies of 20 kHz, typical of Si based semiconductors for example, the large capacitances required are supported by film and electrolytic capacitors. However, wide band gap semiconductor devices are being adopted based on SiC and GaN that switch at even higher frequencies and voltages because these support high conversion efficiencies and smaller sizes.

Low temperature co-fired ceramics (LTCC) have been used to package the semiconductors with other passive components. However, the glass ceramic materials used have low permittivity's of less than 10 and they are primarily used for high frequencies and for low voltage energy conversion as well as for the control electronics. A consequence of this low permittivity is that only low capacitance can be achieve in-situ and higher capacitance values with low voltage discrete capacitors must be incorporated in these packages by surface mounting or embedding.

Provided herein is a power module suitable for use with high voltages and with high switching frequencies. Furthermore, provided herein is a power module for use with high voltage and high switching frequencies which allows for further miniaturization of the power module.

SUMMARY OF THE INVENTION

The present invention is related to an improved power module with integrated passives, particularly capacitors.

More specifically, the present invention is related to an improved power supply with embedded capacitance based on multi-layered ceramic capacitor structures with high permittivity, paraelectric dielectric.

These and other embodiments, as will be realized, are provided in a module for packaging semiconductors comprising:
at least one paraelectric dielectric capacitor (PDC) comprising parallel internal electrodes of alternating polarity with a paraelectric dielectric between adjacent internal electrodes wherein the paraelectric dielectric has a permittivity above 10 to no more than 300; and
wherein the PDC forms a capacitor couple with at least one semiconductor.

BRIEF DESCRIPTION OF FIGURES

FIGS. 5-8 schematically illustrate a PDC of the invention.

DESCRIPTION

The present invention is related to an improved power module and, more specifically, a power module comprising embedded or integral capacitance. More specifically, the present invention is related to improved packaging of high-power electronics using an embedded multilayer ceramic capacitor structure to effectively incorporate capacitance embedded within or integral to the module, or microprocessor, rather than as discrete mounted components.

Improved power module packages are provided which preferably comprise embedded capacitors wherein the embedded capacitors comprise a paraelectric dielectric referred to herein as a paraelectric dielectric capacitor (PDC). The use of PDC's allows for further miniaturization of power modules and operation at higher voltages and higher frequencies. Embedding the PDC in the substrate functionalizes that volume of the substrate thereby providing embedded capacitance without sacrificing circuit area and without the necessity of mounted components. Furthermore, the conduction pathways that form the circuit of the power modules are significantly minimized which improves ESR and ESL thereby improving the electrical functionality of the module. To facilitate this miniaturization capacitors are required that can be operated at higher voltages and frequencies and wherein the capacitors can be packaged close to the wide band gap (WBG) semiconductors in spite of their high junction temperatures which can be around 250° C.

The invention will be described with reference to the figures forming an integral component of the instant disclosure without limit thereto. Throughout the various figures similar elements will be numbered accordingly.

Figure 1:
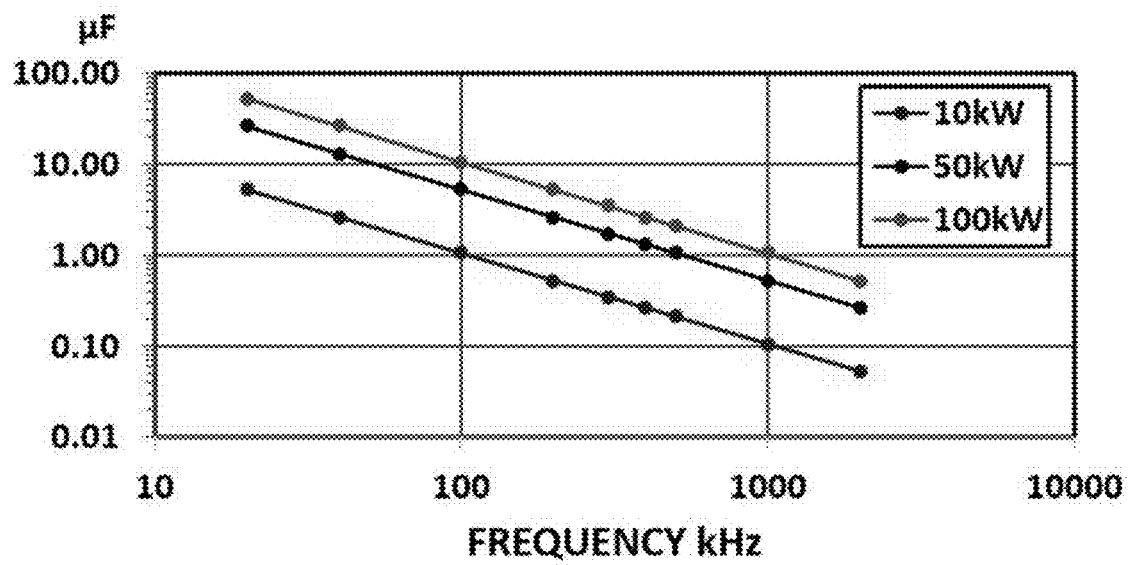
FIG. 1 graphically illustrates capacitance as a function of frequency at various power levels at 400 V with a 10% ripple voltage.
Figure 2:
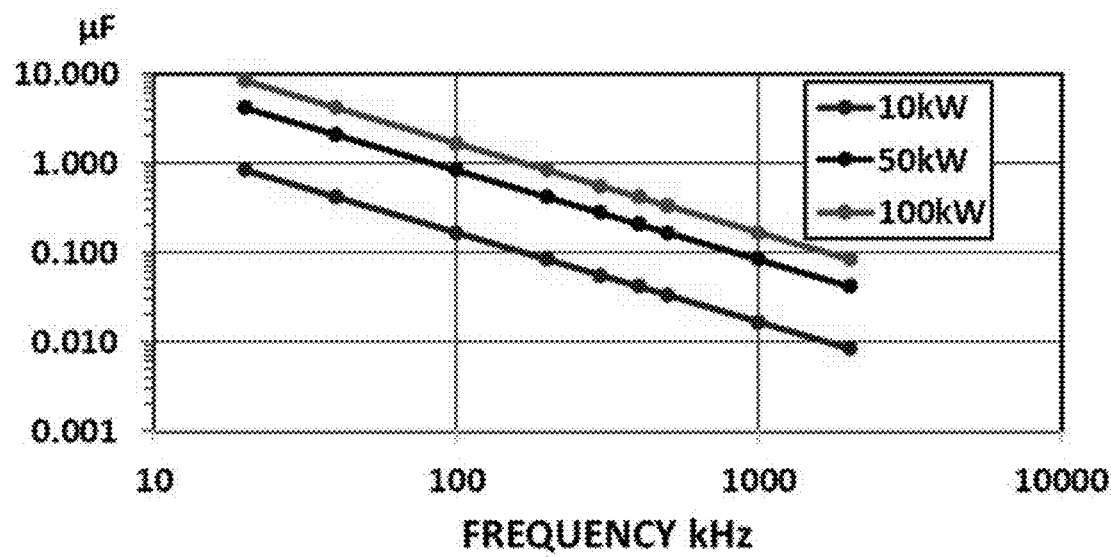
FIG. 2 graphically illustrates capacitance as a function of frequency at various power levels at 1200 V with a 10% ripple voltage.
Figure 3:
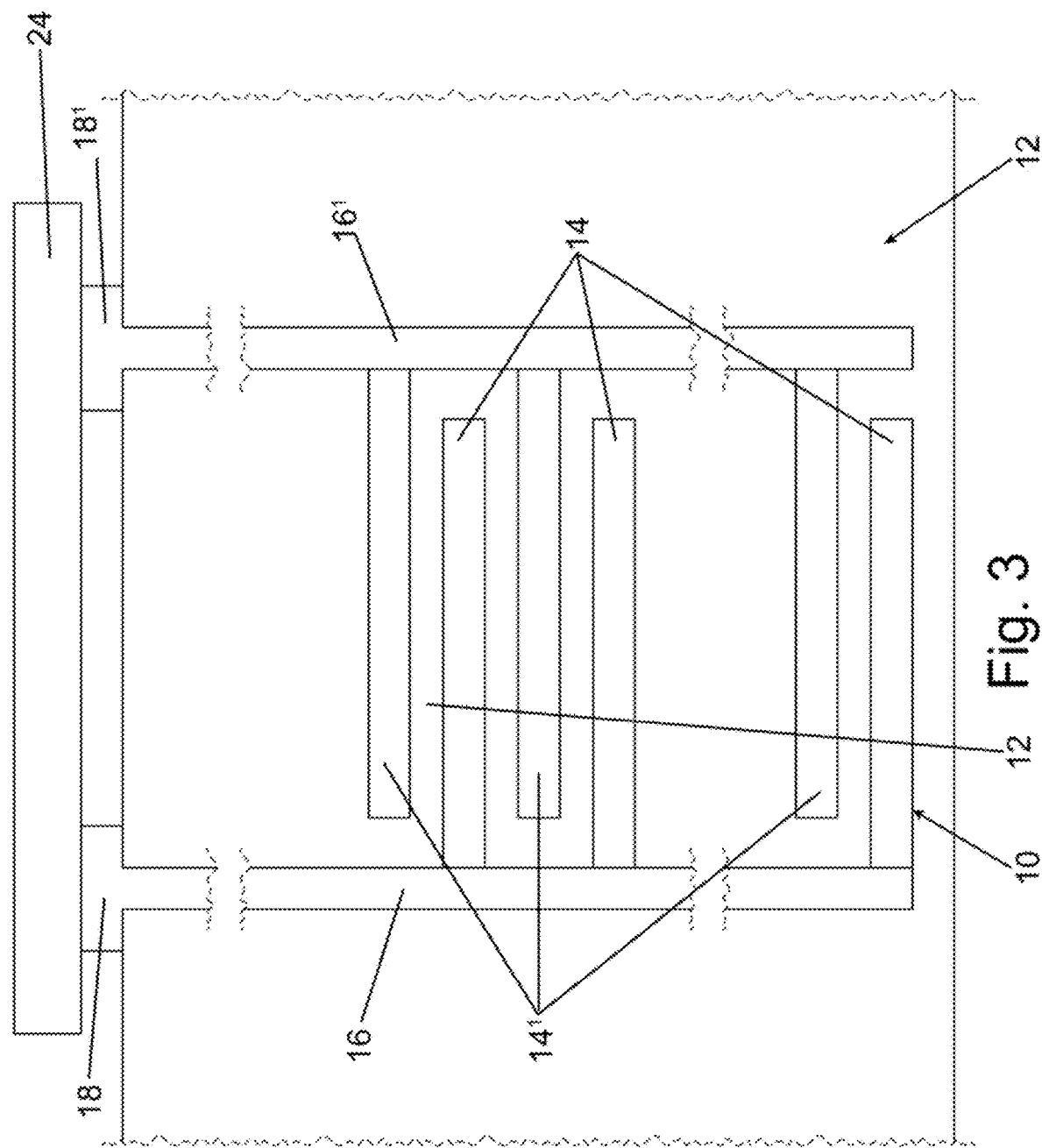
FIG. 3 schematically illustrates an embodiment of the invention.

An embodiment of the invention will be described with reference to FIG. 3. In FIG. 3, a portion of a module is shown in isolation view. A paraelectric dielectric capacitor (PDC) is illustrated at 10. The PDC comprises parallel planar internal electrodes, 14, wherein adjacent electrodes have opposite polarity. Between adjacent electrodes is a paraelectric dielectric, 12. The internal electrodes form a capacitive couple. Capacitive couple terminations, 16, are in electrical contact with alternate internal electrodes, 14, thereby providing electrical connectivity of the capacitive couple to PDC interface pads, 18, or the equivalent thereto, which allow for electrical connection to at least one component, 24, of the module as will be more fully described herein. The connectivity to the interface pad is not particularly limited herein with a preference for mounting by solder balls, solder pillars or wire bonding.

Figure 4:
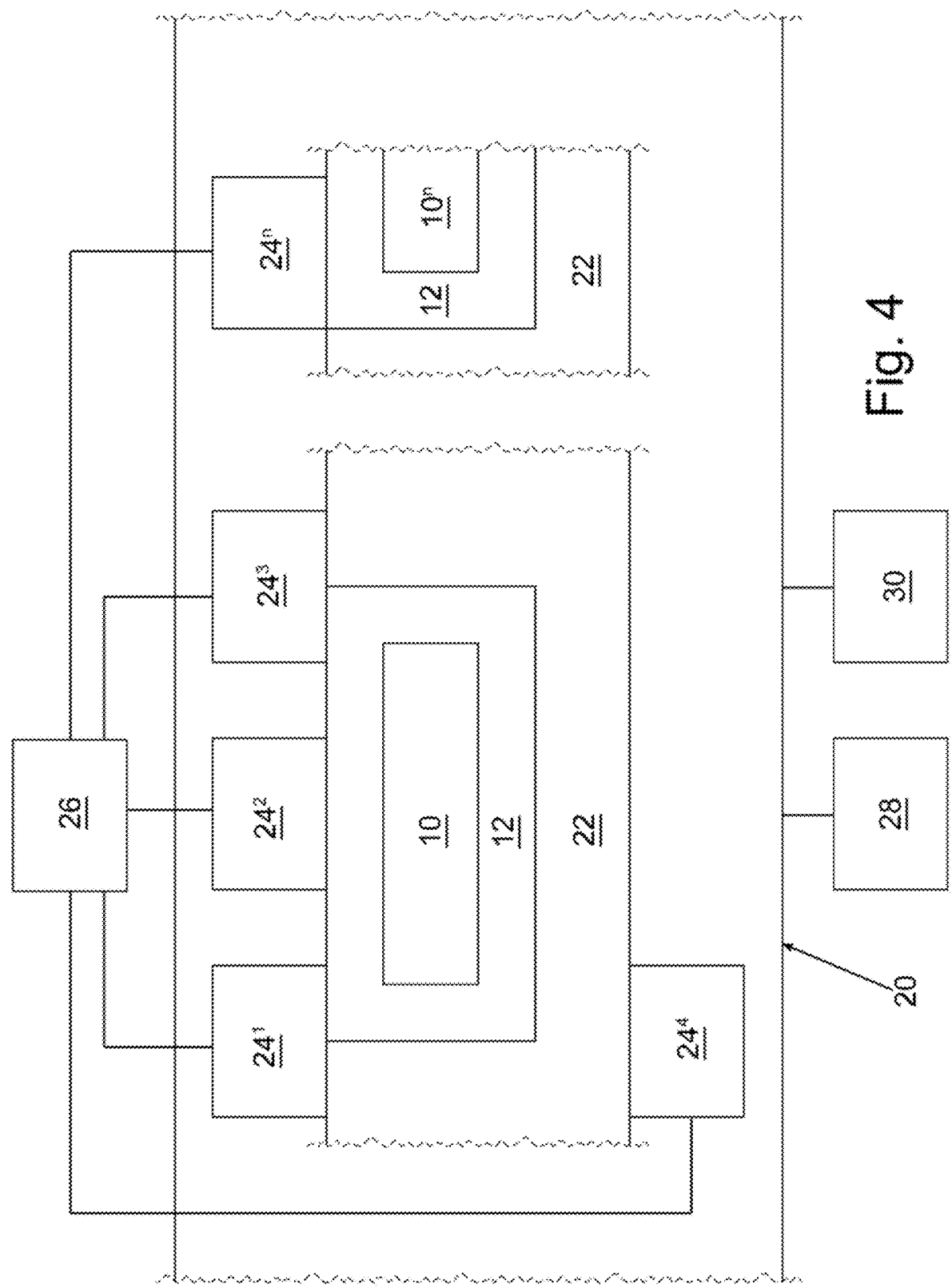
FIG. 4 schematically illustrates an embodiment of the invention.
Figure 6:
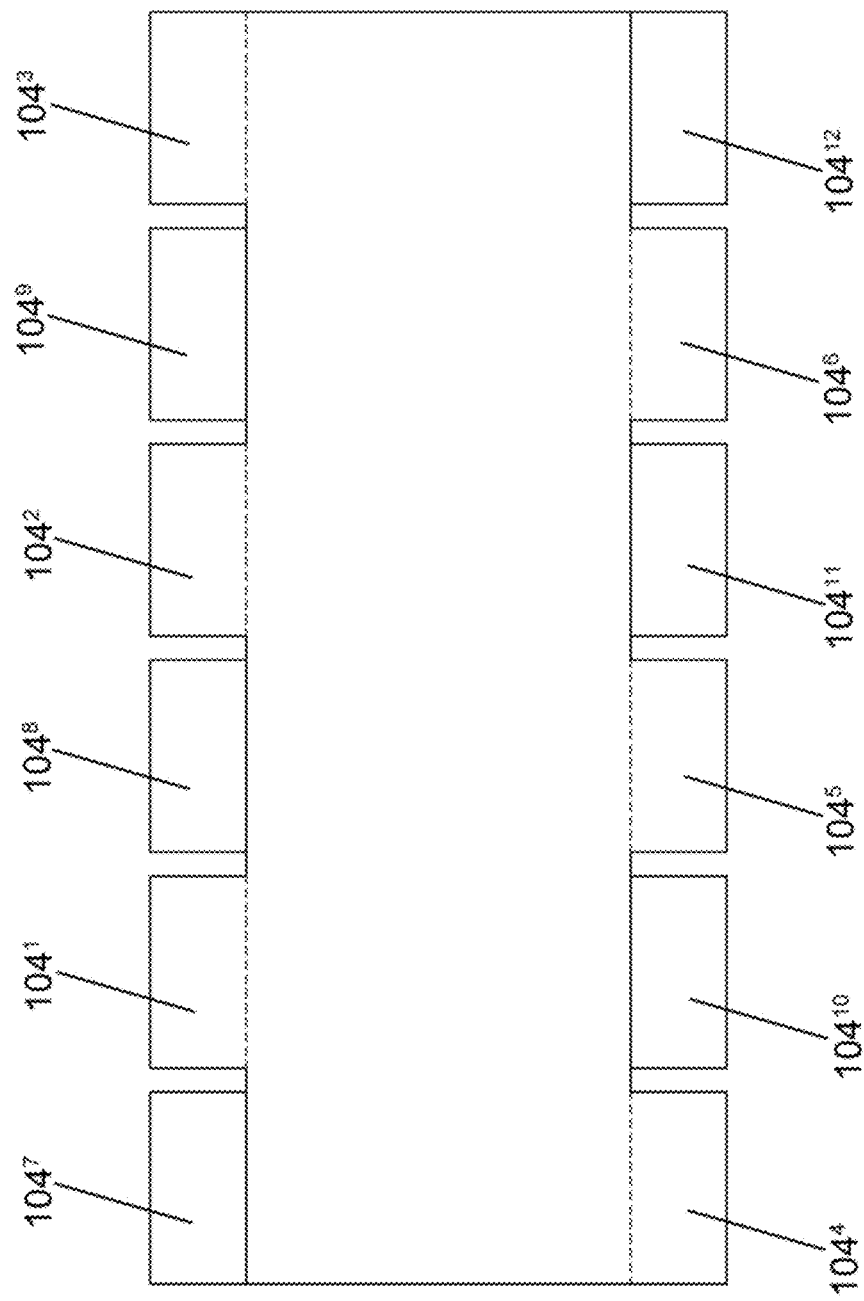
Figure 7:
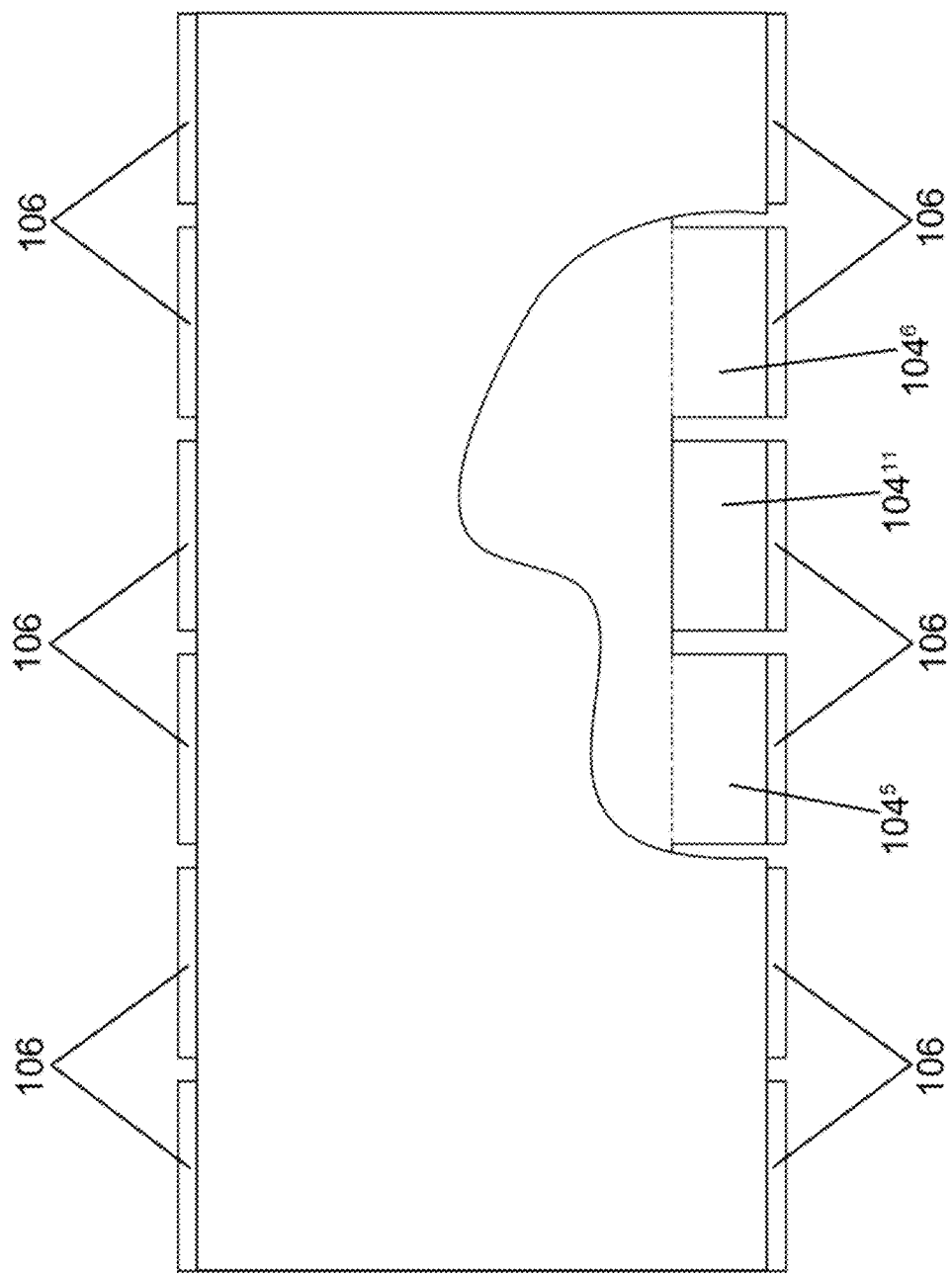

An embodiment of the invention will be described with reference to FIG. 4. In FIG. 4, a module, 20, is illustrated in partial schematic view. The module comprises at least one PDC, 10, embedded in a structural substrate, 22, optionally and preferably with at least the internal electrodes of the PDC encased in paraelectric dielectric, 12. A multiplicity of components, 24, mounted to, on, or in the structural substrate are in electrical connection with each other and/or the PDC to provide the desired electrical function of the module. A power source, 28, provides power to the module and a controller, 26, regulates power provided to a powered device, 30. Circuit traces between the PDC and multiplicity of components are not illustrated in FIG. 4 as the connectivity of components to form a module is known in the art and not limited herein.

The PDC, 10, structural substrate, 22, and components, 24, may be taken together to form a microprocessor wherein the microprocessor is optionally within the module, 20. A PDC embedded in a microprocessor is particularly suitable for use at lower voltages such as less than 200 volts.

A PDC will be described with reference to FIGS. 5-8 wherein a multilayered ceramic capacitor comprising paraelectric dielectric is illustrated schematically. In FIG. 5 a pair of internal electrodes, 100, are illustrated and labeled A and B for the purposes of discussion. In practice the internal electrodes are preferably identical. Each electrode has a capacitance region, 102, and a multiplicity of tabs, 104. The internal electrodes are stacked with paraelectric dielectric between adjacent electrodes with internal electrodes A and B alternating such that the capacitance regions are in registration and alternate tabs, those of internal electrode A for example, are in registration to form a stack of internal electrodes. The stack is illustrated in top schematic view in FIG. 6 wherein adjacent tabs have alternate polarity. The entire assembly is preferably encased in ceramic, preferably the paraelectric dielectric. In the embodiment illustrated in FIG. 7 external terminations, 106, are formed in electrical contact with the registered tabs of common polarity. In use, the external terminations function as the capacitive couple termination which is subsequently in electrical contact with the PDC interface pad. External terminations preferably comprise at least one material selected from copper, nickel, tungsten, silver, palladium, platinum, gold or combinations thereof.

Figure 8:
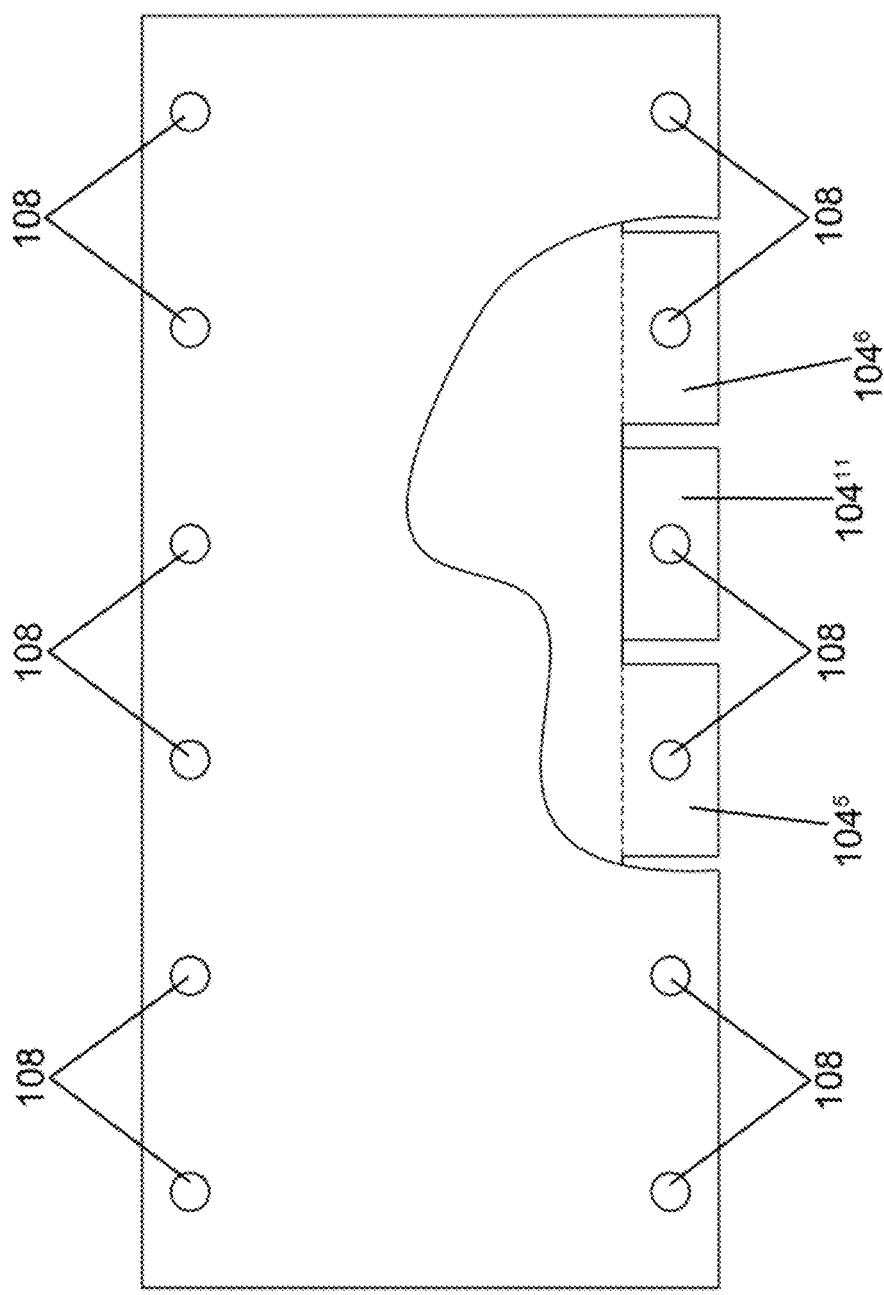

In the embodiment illustrated in FIG. 8 where vias, 108, are formed through the stack of registered tabs of common polarity. The vias function as the capacitive couple termination which is subsequently in electrical contact with the PDC interface pad preferably through an external termination preferable on a surface of said PDC. Vias provide a low thermal resistance pathway to remove unwanted heat from the module. In the case of the preferred calcium zirconate based dielectric with nickel inner electrodes copper filled vias are preferred. The exposed copper surfaces on the tab and vias can be over-plated with nickel, silver, tin, gold, palladium or combinations of these. The vias can be formed by using gaps in the dielectric tapes used in construction or by machining them in the green or fired body. It will also be realized by those skilled in the art that these can be used for purely mechanical attachments when not contacting the inner electrodes. Furthermore, traces on the surface of the part can be formed by screen printing copper with optional over-plating to provide pads and electrical contacts for packaging other components within the module as well as contacting the semi-conductors.

Figure 9:
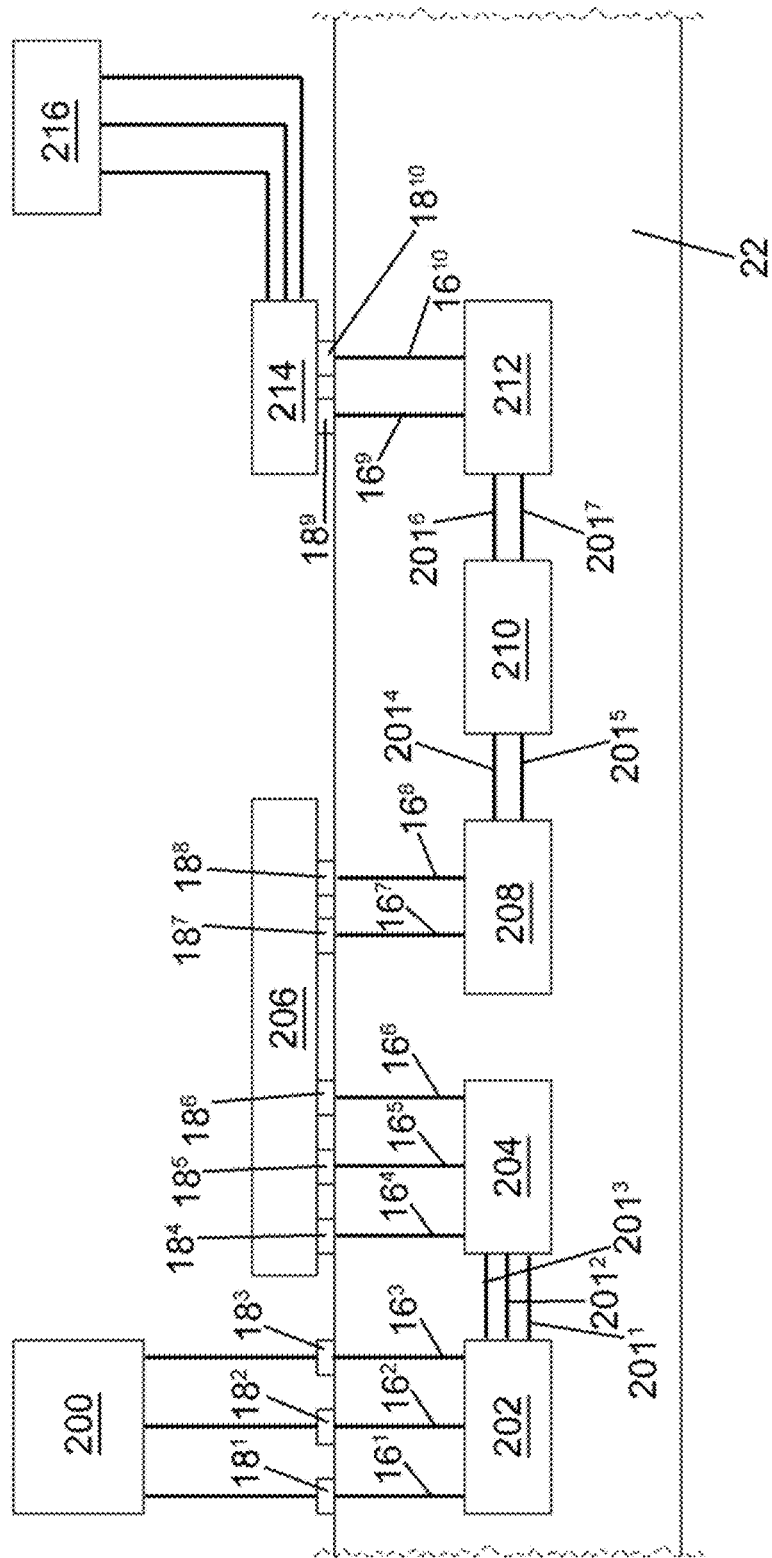
FIG. 9 schematically illustrates an embodiment of the invention.
Figure 10:
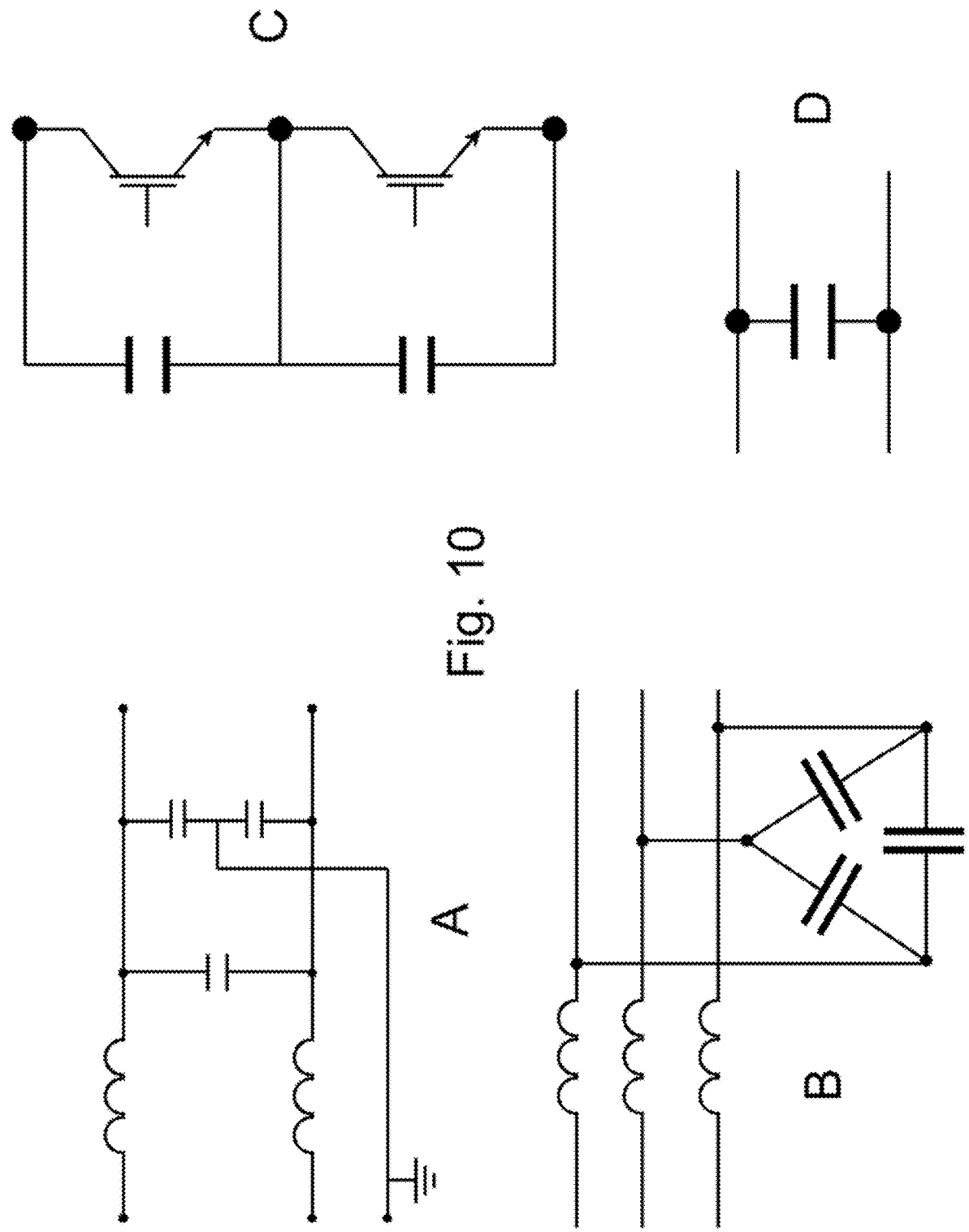
FIG. 10 schematically illustrated representative components of the invention.

An embodiment of the invention will be described with reference to FIG. 9 wherein a three-phase power module is illustrated in schematic view for the purposes of discussion and clarity of description. In FIG. 9 the first component is represented by an AC power source, 200. A second component, represented as an electromagnetic interference or radio frequency interference filter EMI/RFI, 202, can be surface mounted, integral to the AC power source or the EMI/RFI can be embedded in the structural substrate, 22, as illustrated with capacitive couple terminations, $16^1$-$16^3$ terminating at PDC interface pads, $18^1$-$18^3$. A representative EMI/RFI filter is illustrated schematically in FIG. 10 as schematic A. In one embodiment at least the capacitors of the EMI/RFI filter are embedded PDC's as described herein. A third component, represented as an AC harmonic filter, 204, receives the EMI/RFI filtered power preferably through internal electrodes $201^1$-$201^3$. A representative AC harmonic filter is illustrated schematically in FIG. 10 as schematic B. In one embodiment the capacitors and inductors of the AC harmonic filter are embedded PDC's as described herein. A fourth component, represented as an AC/DC converter, 206, can be a mounted device for converting the AC signal to DC. The AC/DC converter can be electrically connected to an AC harmonic filter by capacitive couple terminations, $16^4$-$16^6$ terminating at PDC interface pads, $18^4$-$18^6$ thereby minimizing the conductive path length. Between the AC/DC converter and a fifth component, represented as a DC/AC inverter, 214, are embedded components represented as snubbers, 208 and 212, and a DC Link capacitor, 210. A representative snubber is illustrated schematically in FIG. 10 as schematic C and a representative DC Link capacitor is illustrated schematically in FIG. 10 as schematic D. The capacitors of the snubber are preferably embedded PDC's in electrical communication with PDC interfaces $18^7$-$18^{10}$ by capacitive couple terminations $16^7$-$16^{10}$. The DC Link capacitor is preferably an embedded PDC and is preferably in electrical connectivity with each snubber by internal electrodes $201^3$-$201^6$. The use of internal electrodes improves faraday shielding thereby minimizing EMI noise emanating from the module.

Figure 11:
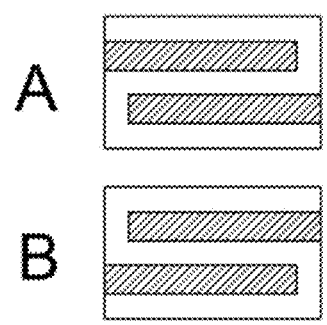
FIGS. 11 and 12 schematically illustrate internal electrode patterns suitable for use in the invention.

In some circuit designs it is advantageous to have the lowest equivalent series inductance (ESL) and/or lowest equivalent series resistance (ESR) for optimum performance. Multiple capacitors with opposing polarity contained within the structure minimizes ESL. As would be realized from FIG. 11 alternately stacking layer A and layer B, as described above relative to FIGS. 5 and 6, provides two capacitive couples within a common structure wherein adjacent external terminations would be of opposite polarity which minimizes ESL.

To prevent ringing of the circuit it is sometimes desirable to increase the ESR of the capacitor. Increasing ESR in an PDC can be accomplished by increasing path length in the internal electrode electrodes of the PDC. As would be realized from FIG. 12, a larger overlap area is achieved by utilizing rectangular internal electrodes as in a PDC formed by alternating layers of A-1 and B-1 with dielectric there between. As the path length to width decreases, as shown from left to right of FIG. 12, the ESR increases. By combining the number of capacitors and electrode shape the ESL and/or ESR can be optimized.

Using these techniques, the performance of the PDC containing module can be optimized.

Low inductances are beneficial because higher switching current edge rates dI/dt and higher switching frequencies in WBG semiconductor applications create greater voltage ringing driving inductive loads. Snubber capacitors placed close to switch package help reduce this ringing. Integrating the snubber in the substrate further reduces the total loop inductance from the snubber to switching device maximizing the benefit of the snubber.

Figure 13:
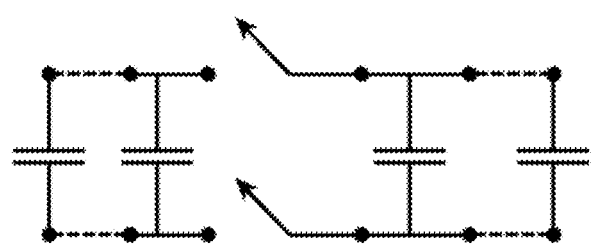
FIGS. 13-16 schematically illustrated embodiments of the invention.
Figure 14:
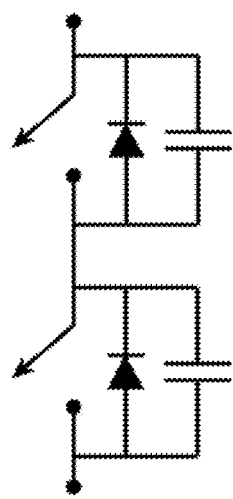
Figure 15:
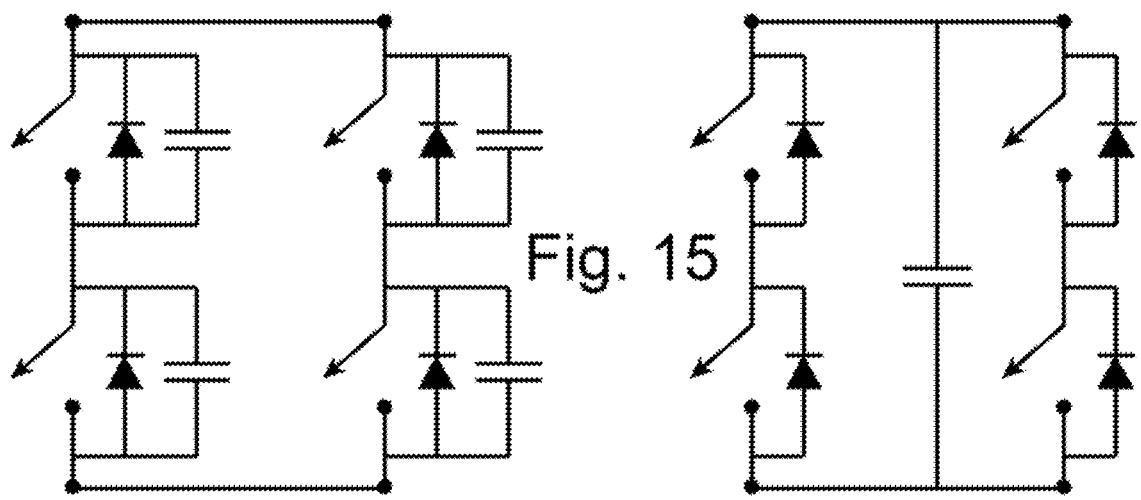
Figure 16:
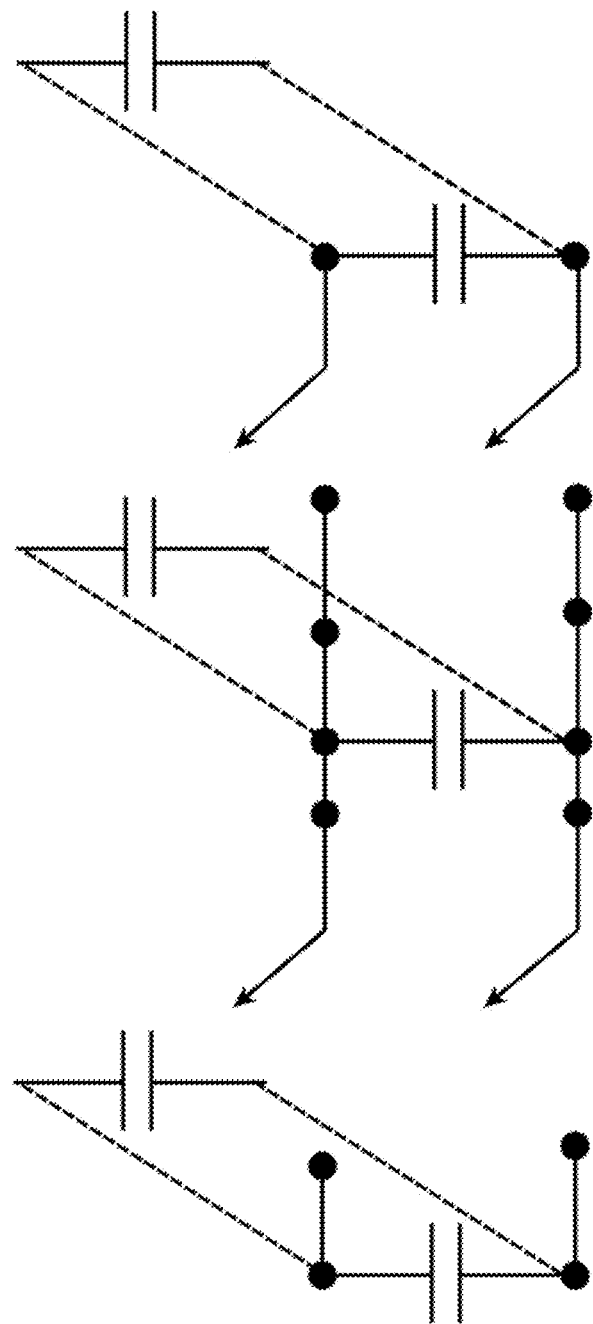

Embedded PDC's, in combination with other components, can provide modules, or electronic packages, suitable for many applications. FIG. 13 schematically illustrates a flying capacitor circuit. FIG. 14 schematically illustrates a zero-voltage switching (ZVS) metal oxide semiconductor field effect transistor (MOSFET) circuit. FIG. 15 schematically illustrates a MOSFET H-Bridge circuit. FIG. 16 schematically illustrates integrated commutation capacitors.

In the examples illustrated in FIG. 13 with 2 switch cells the multi-level flying capacitor inverter commutation loop inductance is a limiting factor. Adding an additional integrated commutation capacitor close to the switch improves commutation performance. In soft switching, as shown in FIG. 14, snubbers can be used to supply charge and discharge currents when load currents change direction to enable zero-voltage switching (ZVS).

In the 4 switch circuits illustrated in FIGS. 15 and 16 adding capacitance close to the switches improves the performance of bulk smoothing capacitors such as DC-link or flying capacitors located further away from the switching device.

Figure 20:
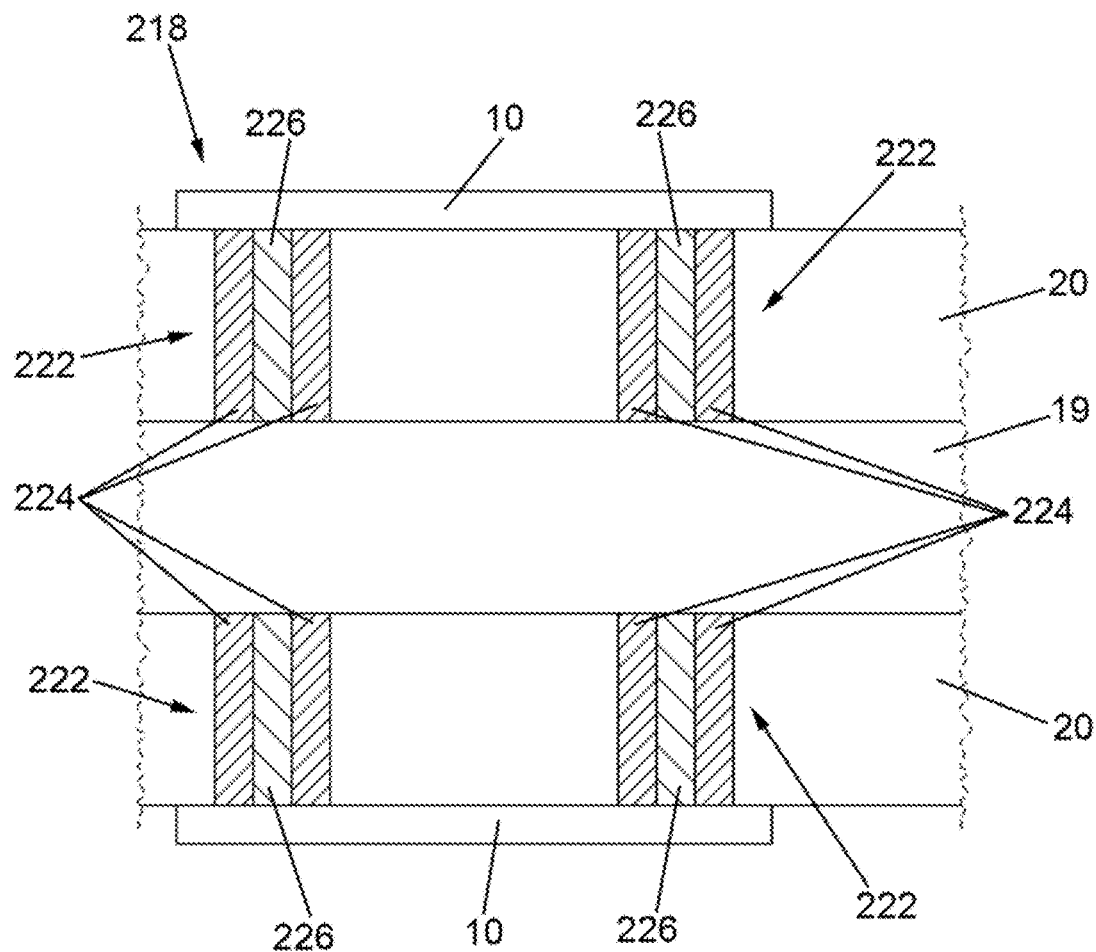
FIG. 20 schematically illustrates an embodiment of the invention.

An embodiment of the invention will be described with reference to FIG. 20. In FIG. 20, a module, 218, has thereon at least one thermal dissipation layer, 20 in contact with at least one semiconductor, 19. The thermal dissipation layer facilitates lateral dissipation of heat from the module. At least one PDC, 10, is in electrical contact with the semiconductor, preferably, with the thermal dissipation layer between the semiconductor and PDC. The PDC can be electrically connected to the semiconductor by insulated vias, 222, through the thermal dissipation layer wherein the insulated via has a conductive core, 226, with an insulator, 224, electrically separating the conductive core from the thermal dissipation layer in the via extending through the thermal dissipation layer.

Using the PDC coupled with vias, particularly through vias provides an alternative to the discrete packaging approach. The resulting multi-capacitor PDC would be packaged to the microprocessor using technologies well known in the prior-art such as solder ball mounting to form an integrated microprocessor-capacitor component. It is contemplated that other types of component could be packaged as part of the PDC, these include ESD suppressors, inductors and other components.

Typical high-power substrates formed from oxides such as $Al_2O_3$, BeO, AlN, $Si_3N_4$, with various metallization's, can be utilized as the thermal dissipation layer. AlN and BeO, for example, are valued for their high thermal conductivity. AlN, for example, has a thermal conductivity of 140-200 W/m-K. However, BeO is poisonous and AlN has issues with Cu metallization reliability. For these reasons $Si_3N_4$, having a thermal conductivity of 35-60 W/m-K, with brazed Al is suitable for demonstration of the invention. To improve the PDC thermal conduction in the z-direction higher thermal conductivity materials are preferred. The PDC may incorporate a cover layer above the last layer of active inner electrodes that comprises a higher thermal conductivity material than the PDC dielectric. It will be realized by those skilled in the art that this could be achieved using an insulating bonding layer or more practically a cover layer comprising the high thermal conductivity dielectric would be co-fired with the PDC during the manufacturing process. In the case of $CaZrO_3$ based dielectrics the combination with air sensitive materials such as AlN, $Si_3N_4$ can be achieved because the high affinity for oxygen. The oxygen is not lost during firing in the reducing atmospheres required for sintering base metal electrodes as well as non-oxide ceramics. Other oxide ceramics loose oxygen and the resulting vacancies can subsequently migrate under electric fields compromising reliability. This behavior of calcium zirconate makes the combination with non-oxide substrate materials feasible. The ability to effectively combine $CaZrO_3$ with these non-oxide substrate materials is also important when the coefficients of thermal expansion (CTE) are considered. This is because it is important to minimize CTE mismatch to improve reliability. Calcium zirconate has a CTE of 8.4 PPM/° C. that is close to commercial $Al_2O_3$ and BeO based substrates that range from 8-10 PPM/° C. However non-oxide substrate materials such as AlN and $Si_3N_4$ have lower CTE's in the range 3.3-5.6 PPM/° C. so effectively combining these materials with $CaZrO_3$ can address this mismatch.

Particularly preferred materials for the thermal dissipation layer are dielectrics with a lower dielectric constant than that of the PDC. A thermal dissipation layer comprising a dielectric with a lower dielectric constant than the ceramic of the PDC has particular advantages with regards to high frequency performance.

In another embodiment the problems associated with internal self-heating of A PDC can be mitigated by the introduction of at least one, preferably continuous, thermal dissipation channel through the PDC body that allows the core temperature of the PDC to be reduced by transmission of heat through a thermal transfer medium. Although the internal electrodes of the PDC more effectively dissipate heat through the plane of the electrodes to the terminations in high power applications there is a need to more effectively remove heat. The thermal transfer medium may be static, have limited flow, or it may flow into and through the thermal dissipation channel to increase the transfer of heat away from the interior of the MLCC.

Figure 21:
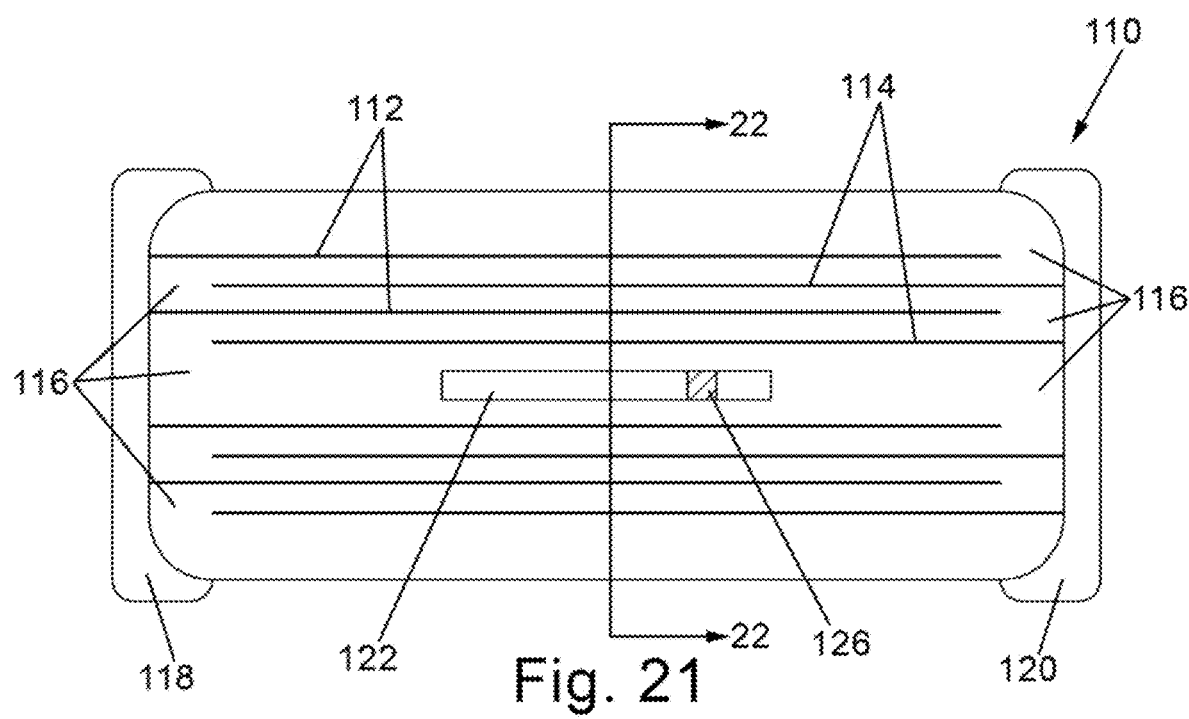
FIG. 21 schematically illustrated an embodiment of the invention.
Figure 22:
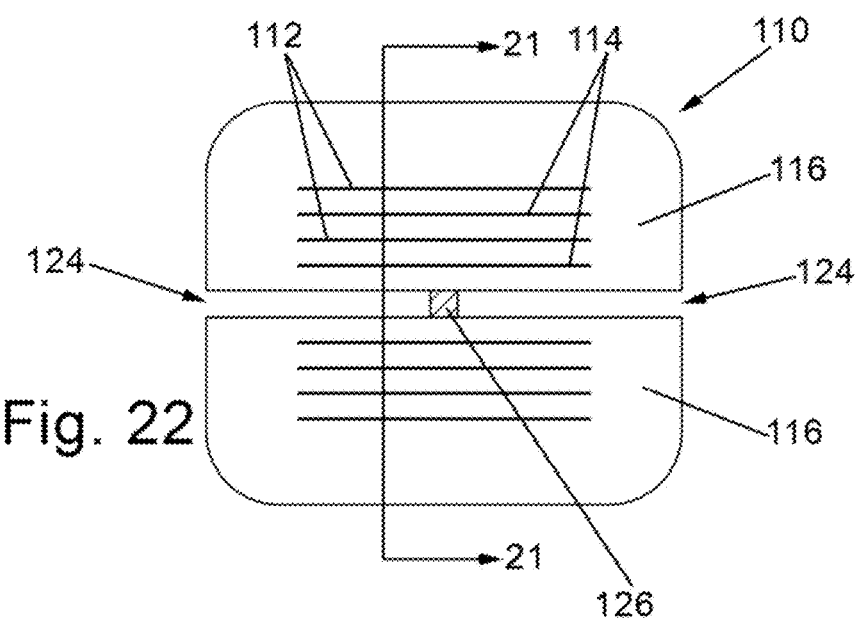
FIG. 22 schematically illustrated an embodiment of the invention.

An embodiment of the invention will be described with reference to FIGS. 21 and 22 wherein an inventive PDC, generally represented at 110, is illustrated in cross-sectional schematic side view in FIG. 21 and cross-sectional schematic end view in FIG. 22. In FIGS. 21 and 22 the PDC comprises interleaved parallel internal electrodes, 112 and 114, with dielectric, 116, there between wherein adjacent internal electrodes terminate at external terminations, 118 and 120, of opposite polarity. A thermal dissipation channel, 122, which is parallel to the internal electrodes preferably breaches at least one surface of the capacitor body and more preferably provides a channel with continuous passage through the capacitor body. The termination of the thermal dissipation channel, or mouth, is preferably at a location on the surface of the capacitor body which is void of external terminations thereby allowing for access to the mouths, 124, of the channel to allow thermal transfer medium to enter one mouth of the thermal dissipation channel and exit the thermal dissipation channel preferably at a different mouth. Optional struts, 126, spanning the height of the thermal dissipation channel may be provided to improve structural integrity or to provide turbulence to decrease laminar flow thereby increasing the rate of thermal transfer between the capacitor body and thermal transfer medium. A strut preferably does not extend the entire width of the capacitor, such as from mouth to mouth. In the embodiment of FIGS. 21 and 22 the thermal dissipation channel is bound on all sides by ceramic with no point of contact between the thermal dissipation channel and internal electrodes, 112 and 114. Ceramic is not an efficient thermal conductor and therefore a thermal dissipation channel bound on all sides by ceramic lacks thermal transfer efficiency. However, the ceramic is not electrically conductive which allows for a wider range of thermal transfer mediums and therefore this embodiment is advantageous in some applications.

In an alternative embodiment the thermal dissipation channel is bound on three side by ceramic and on at least a portion of one side by an internal electrode. In another alternative embodiment the thermal dissipation channel is bound on two sides by ceramic and on at least a portion of two sides by internal electrodes as illustrated and described in U.S. Pat. No. 10,147,544 which is incorporated herein by reference. A particular advantage of the thermal dissipation channel being bound by at least one internal electrode is the enhanced thermal transfer provided by the internal electrodes which are typically more efficient at thermal transfer than the ceramic. If the thermal transfer medium is in contact with an internal electrode it is preferable that the thermal transfer medium be non-conductive and non-corrosive.

Figure 23:
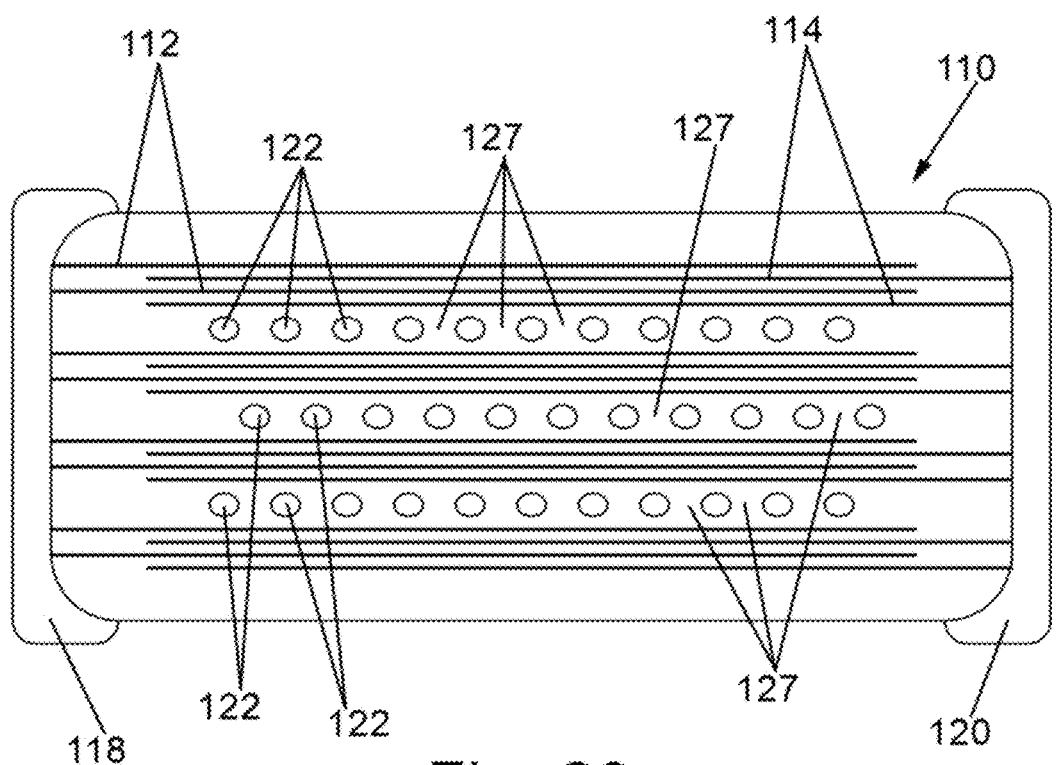
FIG. 23 schematically illustrated an embodiment of the invention.

An embodiment of the invention will be described with reference to FIG. 23 wherein an inventive PDC, generally represented at 110, is illustrated in cross-sectional schematic side view. In FIG. 23, the PDC comprises multiple thermal dissipation channels, 122, with barriers, 127, there between wherein the thermal dissipation channels are arranged in multiple common dissipation channel planes wherein each common dissipation channel plane is parallel to the internal electrodes.

Figure 24:
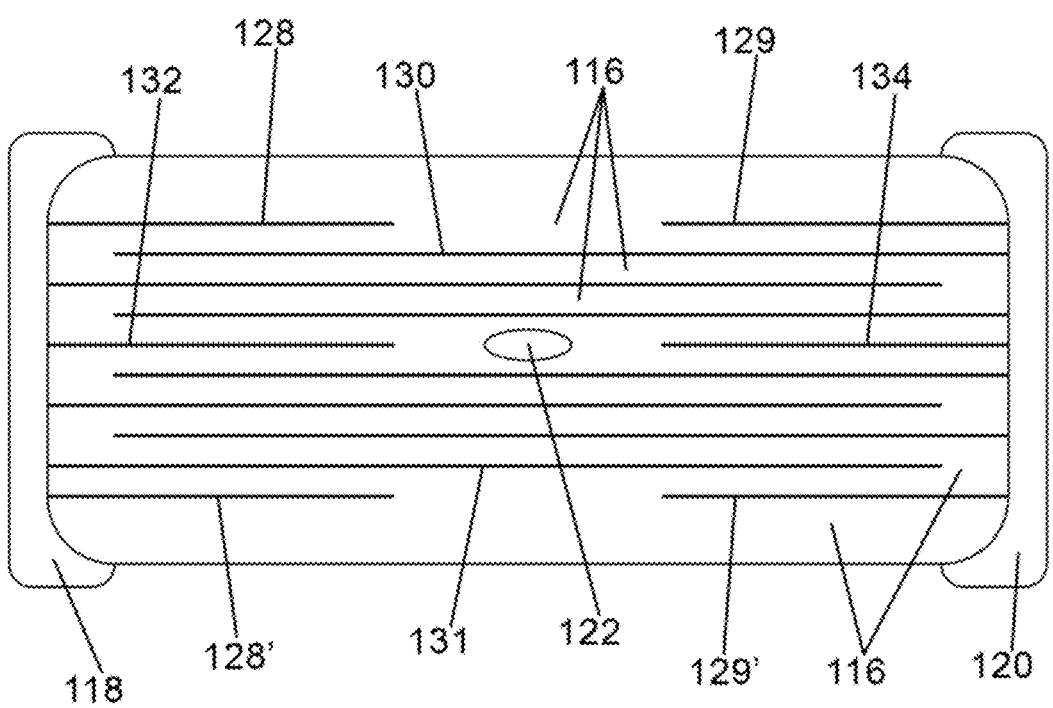
FIG. 24 schematically illustrated an embodiment of the invention.

An embodiment of the invention will be described with reference to FIG. 24 wherein a PDC is illustrated in cross-sectional schematic view. In FIG. 24 the external terminations, 118 and 120, and ceramic, 116, are as described above. Shield electrodes, 128 and 129, are illustrated wherein shield electrodes are defined as coplanar electrodes of opposite polarity positioned as the outermost internal electrodes in a PDC. Shield electrodes inhibit arcing from the external termination to the internal electrode of opposite polarity. By way of example, electrodes 128 and 129', inhibit arcing between the external termination and closest internal electrode of opposing polarity indicated as 130 and 131. A thermal dissipation channel, 122, is coplanar with coplanar internal electrodes, 132 and 134, of opposite polarity. In the embodiment illustrated in FIG. 24 the thermal dissipation channel is bound on all sides by ceramic as described previously.

Figure 25:
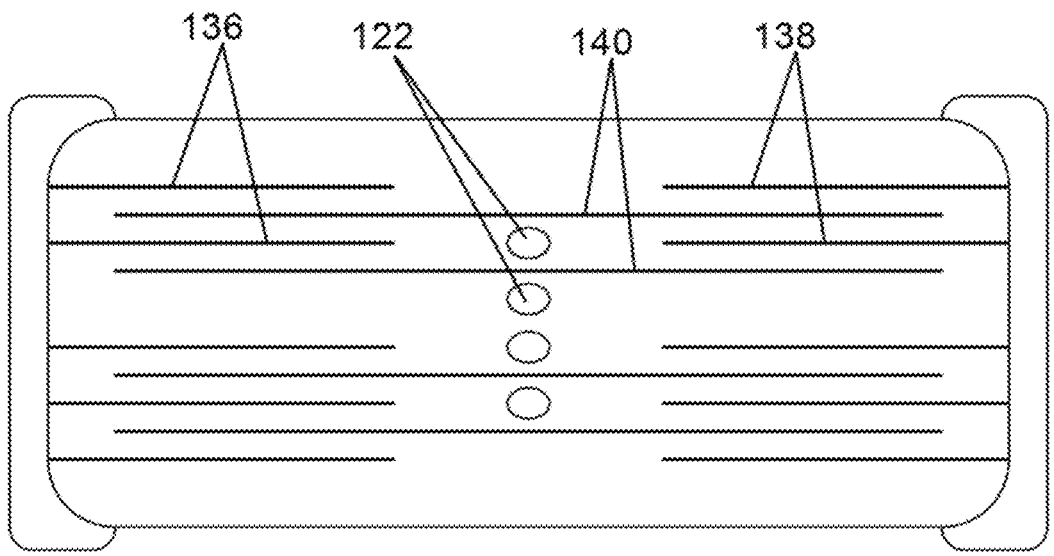
FIG. 25 schematically illustrated an embodiment of the invention.

An embodiment of the invention will be described with reference to FIG. 25 wherein a PDC is illustrated in cross-sectional schematic view. The PDC of FIG. 25, comprises coplanar active internal electrodes, 136 and 138, of opposite polarity with floating electrodes, 140, in a plane parallel to the coplanar active internal electrodes and preferably each floating electrode has coplanar active internal electrodes adjacent to each side. An active electrode is defined herein as an internal electrode which is in electrical contact with an external termination. A floating electrode is an internal electrode which is not in electrical contact with an external termination. At least one thermal dissipation channel, 122, is coplanar with coplanar active electrodes of opposite polarity.

Figure 26:
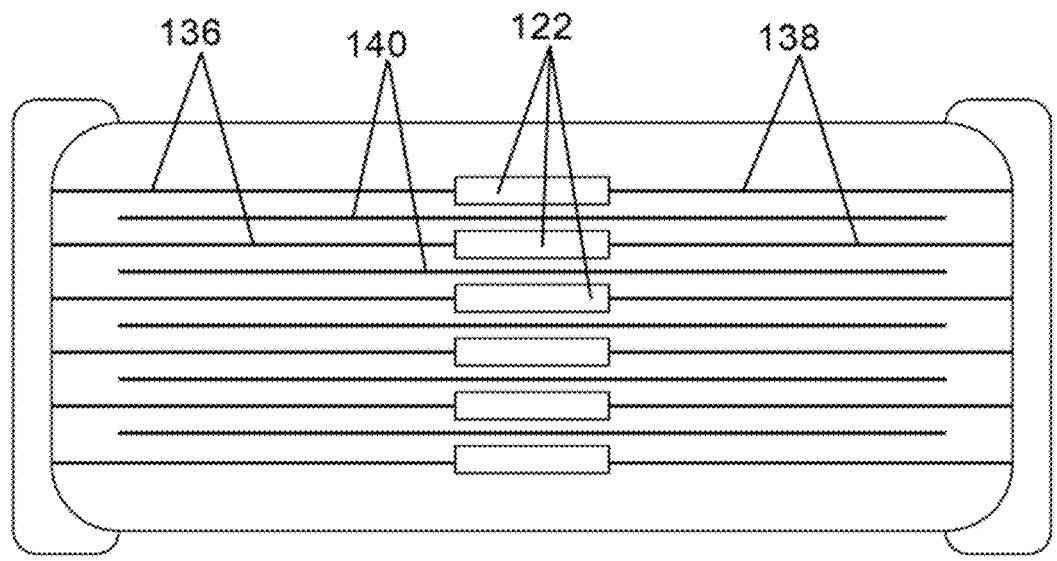
FIG. 26 schematically illustrated an embodiment of the invention.

An embodiment of the invention will be described with reference to FIG. 26 wherein a PDC is illustrated in cross-sectional schematic view. The PDC of FIG. 26 comprises coplanar active internal electrodes, 136 and 138, of opposite polarity with floating electrodes, 140, in a plane parallel to the coplanar active internal electrodes and preferably each floating electrode has coplanar active internal electrodes adjacent to each side. At least one thermal dissipation channel, 122, is coplanar with the coplanar active internal electrodes and optionally in flow contact with the internal electrodes.

Figure 27:
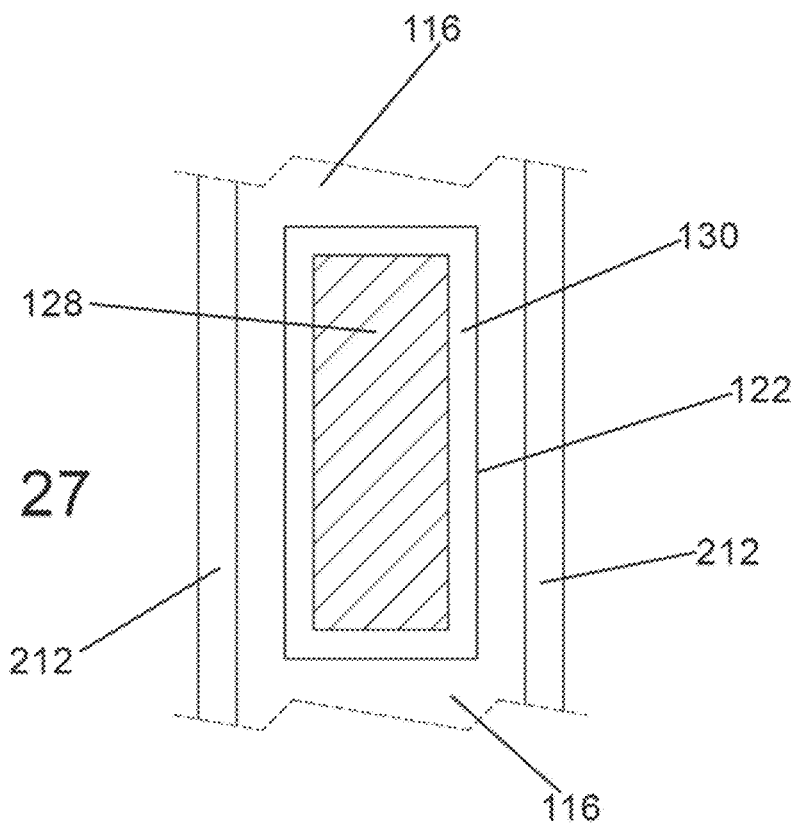
FIG. 27 schematically illustrated an embodiment of the invention.
Figure 28:
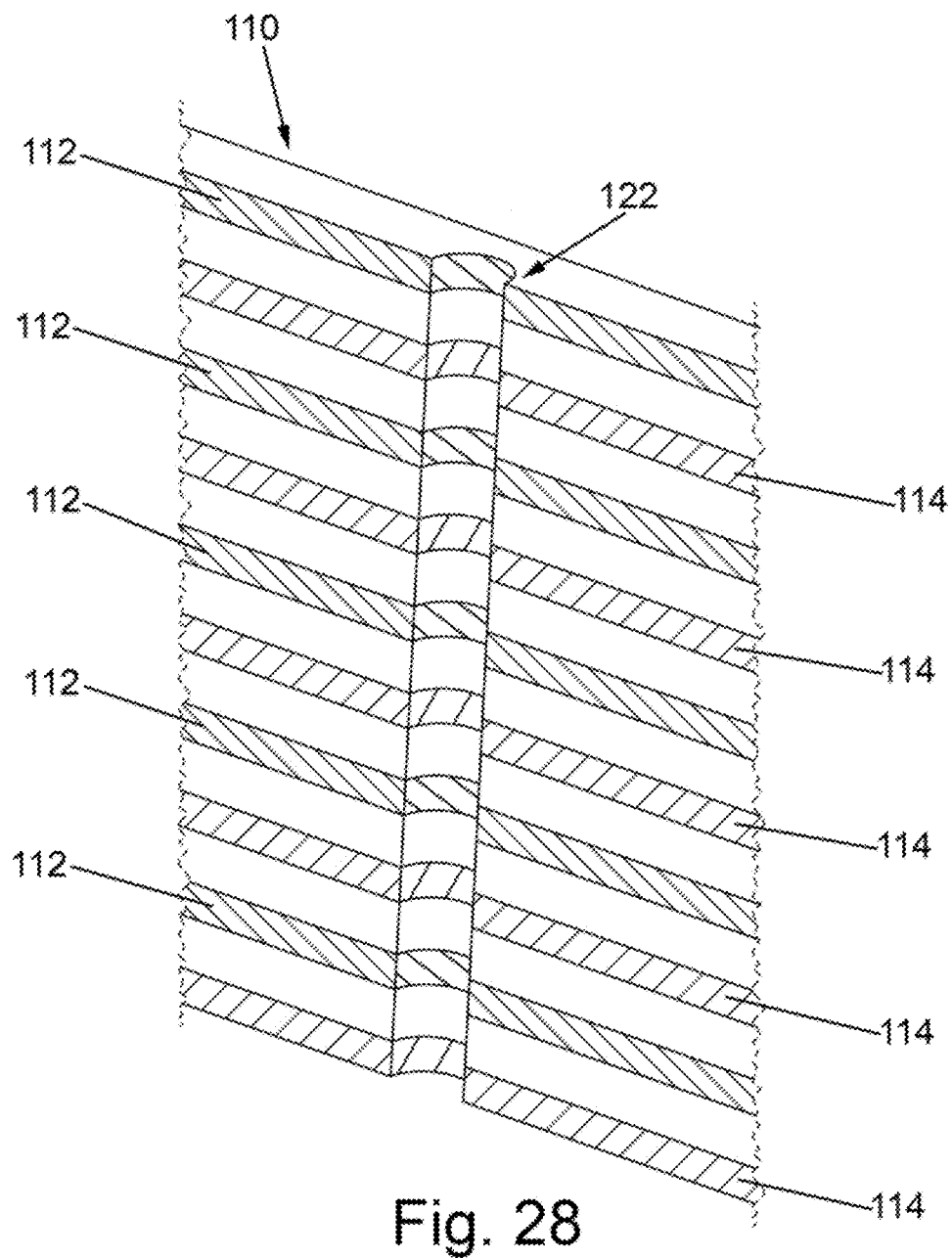
FIG. 28 schematically illustrated an embodiment of the invention.
Figure 17:
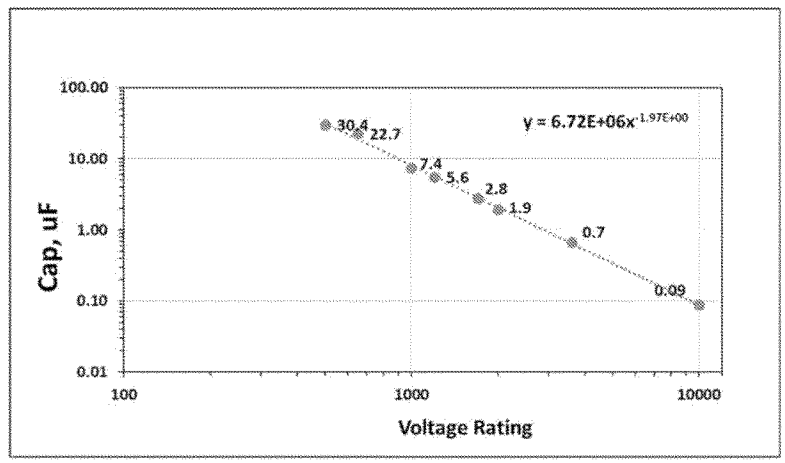
Figure 18:
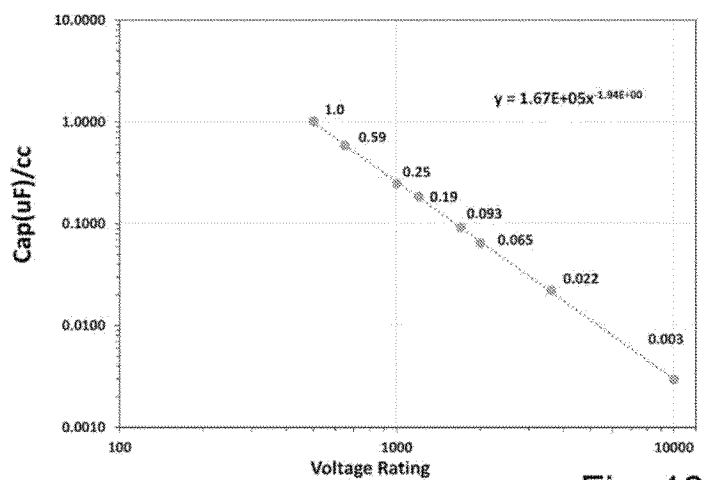

An embodiment of the invention will be described with reference to FIG. 27 wherein a PDC is illustrated in cross-sectional schematic view. In FIG. 27 the thermal dissipation channel, 122, has coated on the interior thereof an optional coating, 130, which is preferably a thermally conductive coating thereby increasing the thermal conduction between the ceramic and thermal transfer medium, 128. The coating material is not particularly limited herein with a preference for materials that can coat the dielectric and provide adequate thermal transfer from the dielectric to the thermal transfer medium. An embodiment of the invention will be described with reference to FIG. 28. In FIG. 28, a PDC, 110, has a thermal dissipation channel, 122, which is not parallel to the electrodes, 112 and 114, and is preferably perpendicular to the electrodes. By utilizing a thermal dissipation channel which passes through the electrodes higher contact between the thermal transfer medium and internal electrodes can be made. In one embodiment the thermal transfer medium is not electrically conductive. In another embodiment a thermally conductive, but electrically insulative, coating can be applied to the interior of the thermal dissipation channel.

Figure 29:
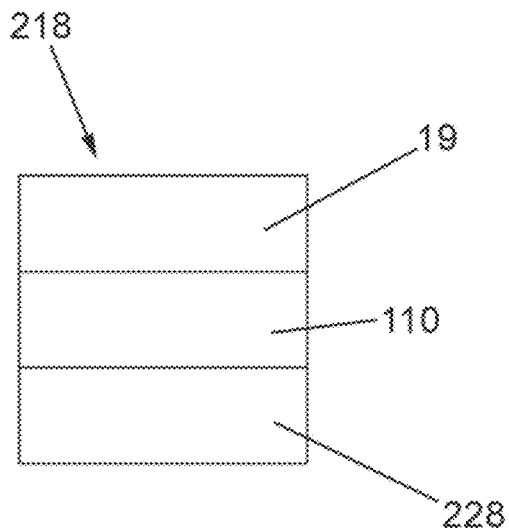
FIG. 29 schematically illustrated an embodiment of the invention.

An embodiment of the invention will be described with reference to FIG. 29. In FIG. 29, a module, 218, has a PDC, 110, mounted to at least one semiconductor, 19, wherein the PDC comprises at least one thermal dissipation channel therethrough wherein the thermal dissipation channel is parallel to the electrodes, perpendicular to the electrodes, or at an intermediate angle there between. A cooling device, 228, dissipates the heat collected through the thermal dissipation channel. The cooling device can be a passive device which dissipates heat by interaction with medium, preferably air, such as a heat sink. Alternatively, the cooling device can be an active device which dissipates heat by electrical, mechanical or chemical methods such as by adiabatic expansion, flowing medium or by Peltier techniques.

Thermally conductive inorganic or organics materials comprising metals, thermally conductive ceramics, polymers and combinations thereof are particularly suitable for demonstration of the invention. Silicone thermal greases are particularly preferred due to their high thermal conductivity, low thermal resistance, cost, processability and reworkability. By way of non-limiting example, Dow Corning® TC-5026, Dow Corning® TC-5022, Dow Corning® TC-5600, Dow Corning® TC-5121, Dow Corning® SE4490CV, Dow Corning® SC 102; Dow Corning® 340 Heat Sink; Shin-Etsu MicroSI® X23-7853W1, Shin-Etsu MicroSI® X23-7783 D, Shin-Etsu MicroSI® G751 and Shin-Etsu MicroSI® X23-7762D are particularly suitable for use as a coating in the thermal dissipation channel.

The thermal transfer medium may be gas or liquid, either static or flowing to improve thermal conduction. Materials which are not electrical conductors are particularly preferred. Per-fluorinated hydrocarbons, nanofluids, mineral oils and ethers are particularly suitable due to their efficient thermal transfer capabilities with minimal electrical conductivity. By way of non-limiting example, Galden® HT55, Galden® HT70, Galden® HT80, Galden® HT110, Galden® HT135, Galden® HT170, Galden® HT200, Galden® HT230 and Galden® HT270 are particularly suitable as a thermal transfer medium for use in demonstrating the invention. Gases such as air, at least partially dried air, or inert gases are particularly suitable as a thermal transfer medium.

The thermal dissipation channels can be formed by a variety of techniques during the manufacture of the PDC. Layers of ceramic precursor can be printed with sacrificial organic materials or carbon in a predetermined pattern corresponding to the thermal dissipation channel. The sacrificial organic material or carbon is removed, preferably by vaporization, during the bake out and co-sintering of the PDC. Areas of ceramic tape can be removed prior to lamination of the PDC or the thermal dissipation channel can be machined out before or after bakeout and sintering.

PDC's are prepared by sequentially layering ceramic precursors and conductor precursors in appropriate registration as known in the art. After a sufficient number of layers are built up the assembly is heated to form alternating layers of internal conductors and sintered ceramic with thermal dissipation channel precursors in the ceramic layers.

In each layer intended to have a thermal dissipation channel a pre-channel material is printed in a pattern which will correspond to the thermal dissipation channel. Upon sintering the pre-channel material vaporizes leaving a void in the shape of the printed pre-channel material. A non-volatile material, preferably a ceramic, may be added to the pre-channel material to form supporting struts in the void.

The pre-channel material is any material which can be applied in a predetermined pattern and, upon sintering of the layer, leaves a thermal dissipation channel as a void. A particularly preferred material is an electrode ink with the metal excluded there from. Such materials are preferred due to their ready availability and their inherent suitability with the manufacturing environment. Another particularly suitable material is a binder, as used with the ceramic precursor, wherein the ceramic precursor is excluded.

Large areas of structural substrate typically have no electrical function. Reallocating those areas to form embedded capacitance provides an increased overlap area for the capacitive couple without increasing total volume of the module. These advantages, coupled with the high permittivity of the dielectric, provides for high capacitance values in an area of the power module which is otherwise electrically functionless. Furthermore, by incorporating high voltage capacitance within the structure surface arcing between components of opposite polarity is essentially eliminated which is a major advantage relative to surface mounted discrete components.

The ceramic material used in the construction of the PDC's is critical for reliable function and higher voltages such as those above 200V. This is because multilayer ceramic structures can couple strongly with high voltage resulting in a mechanical movement that is the basis of ceramic actuators. This electro-strictive coupling is high in ferroelectric and anti-ferroelectric type materials and this can induce failures in high voltage capacitors. For this reason, the preferred ceramic material is paraelectric with a low electro-strictive coupling coefficient. Particularly preferred are paraelectric dielectrics with a relative permittivity above 10 to no more than 300 and more preferably at least 25 to no more than 175. Particularly preferred paraelectric dielectrics comprise calcium zirconate, non-stoichiometric barium titanium oxides such as $Ba_2Ti_9O_{20}$; $BaTi_4O_9$; barium rare-earth oxides containing neodymium or praseodymium, titania doped with various additives, calcium titanate, strontium titanate, strontium zirconate, zinc magnesium titanate, zirconium tin titanate, bismuth zinc niobates, bismuth zinc tantalates and combinations thereof. In particular EIA Class 1 type dielectrics are preferred particularly those containing at least 50% by weight calcium zirconate. Furthermore, temperature stable dielectrics of this type that meet C0G designation are most preferred. C0G designates a dielectric with a thermal coefficient of capacitance of ±30° C. PDC's utilizing calcium zirconates can achieve voltage ratings of 1V up to 10,000V and more preferably up to 20,000V with operating temperatures of at least 260° C. Using calcium zirconate as the dielectric, with a relative permittivity of 32, PDC can be obtained with a voltage rating of 500V to 10,000V having a capacitance per unit volume of 1.0 µF/cc rated at 500V and a capacitance per unit volume of at least 0.003 µF/cc rated 10,000V and which is suitable for a rated operating temperature range −65 to 300° C. and maximum rated temperature from 150 to 300° C.

The structural substrate suitable for the invention is not particularly limited herein with the proviso that it can withstand the voltage and temperature ranges contemplated for the high voltage, high switching frequency applications. It would be understood to those of skill in the art that the structural substrate not interfere with the functionality of the PDC and that the PDC be electrically isolated from the structural substrate if the structural substrate is conductive. Non-conductive substrates are preferred. Particularly preferred structural substrates include ceramics such as alumina such as 96% $Al_2O_3$ or 99.6% $Al_2O_3$; aluminum nitride; silicon nitride or beryllium oxide; G10; FR (Flame Retardant) materials such as FR 1-6, FR 4 which is a composite of epoxy and glass, FR2 utilizing phenolic paper or phenolic cotton and paper; Composite Epoxy Materials (CEM) such as CEM 1, 2, 3, 4, 5; insulated metal substrates such as aluminum substrates available from Bergquist Mfg. and flex circuits comprising materials such as polyimide. Laminates, fiber reinforced resins, ceramic filled resins, specialty materials and flexible substrates are particularly suitable. Flame Retardant (FR) laminates are particularly suitable as an interposer material and especially FR-1, FR-2, FR-3, FR-4, FR-5 or FR-6. FR-2 is a phenolic paper, phenolic cotton paper or paper impregnated with phenol formaldehyde resin. FR-4 is particularly preferred which is a woven fiberglass cloth impregnated with epoxy resin. Composite epoxy materials (CEM) are suitable and particularly CEM-1, CEM-2, CEM-3, CEM-4 or CEM-5 each of which comprise reinforcement such as a cotton paper, non-woven glass or woven glass in epoxy. Glass substrates (G) are widely used such as G-5, G-7, G-9, G-10, G-11 and others with G-10 and G-11 being most preferred each of which is a woven glass in epoxy. Polytetrafluoroethylene (PTFE), which can be ceramic filled, or fiberglass reinforced such as in RF-35, are a particularly suitable substrates. Polyether ether ketone (PEEK) is also a suitable polymer particularly because of its high temperature resistance. Electronic grade ceramic materials such alumina or yttria stabilized zirconia are available with 96% $Al_2O_3$ and 99.6% $Al_2O_3$ being readily available commercially. Bismaleimide-Triazine (BT) epoxy is a particularly suitable substrate material. Flexible substrates are typically a polyimide such as a polyimide foil available commercially as Kapton or UPILEX or a polyimide-fluoropolymer composite commercially available as Pyralux. These substrates may incorporate leads made with ferrous alloys such as Alloy 42, Invar, Kovar or non-ferrous materials such as Cu, Phosphor Bronze or BeCu.

The components are selected from transistors, capacitors, diodes, resistors, varistors, inductors, fuses, integrated circuits, overvoltage discharge devices, sensors, switches, electrostatic discharge suppressors, invertors, rectifiers and filters. Particularly preferred transistors are GaN and SiC based wide band gap devices. The components are preferably integral to functional devices such as AC/DC converters, DC/AC inverters, EMI/RFI filters, snubbers, harmonic filters and particularly AC harmonic filters.

The internal electrodes preferably comprise base metals such as nickel, copper or precious/semi-precious metals such as silver, palladium, tungsten, platinum or gold or combinations thereof with nickel or nickel alloys being preferred. Preferred nickel alloys comprise at least one member selected from Mn, Cr, Co, and Al, with such nickel alloys containing at least 95 wt. % of nickel being more preferred. It is to be noted that nickel and nickel alloys may contain up to about 0.1 wt. % of phosphorous and other trace components.

EXAMPLE

Figure 12:
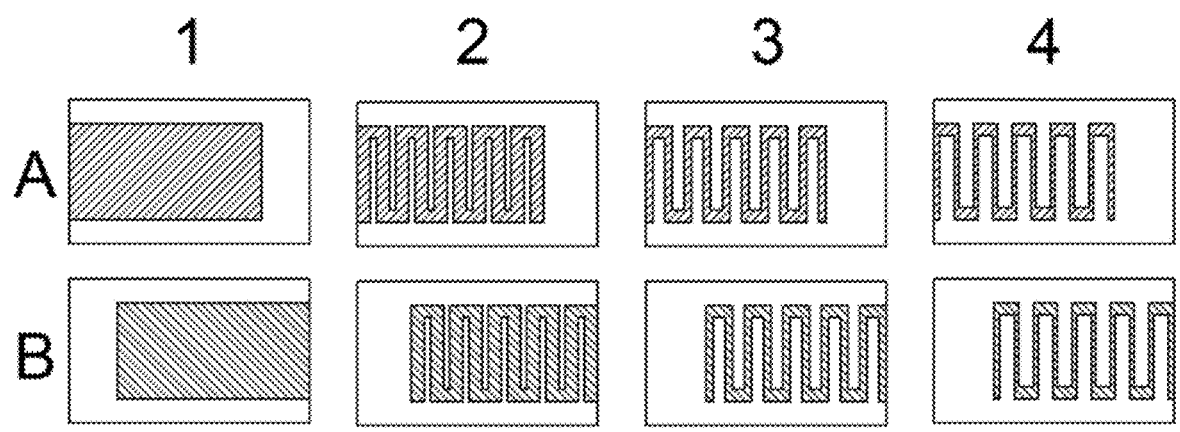
Figure 19:
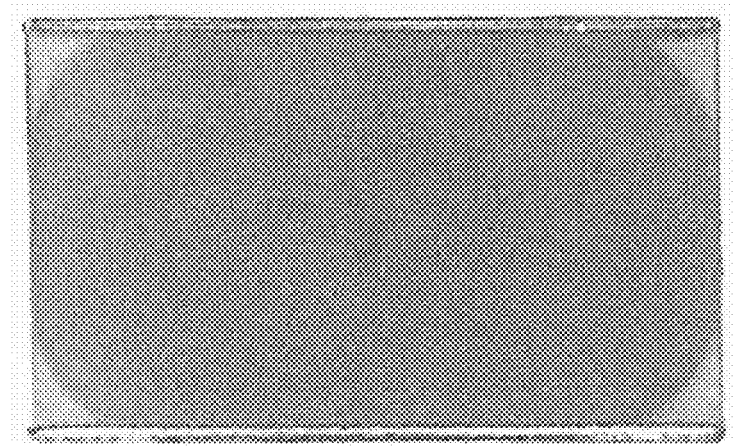
FIG. 19 is an image of an embodiment of the invention.

A PDC was prepared comprising a paraelectric dielectric and nickel electrodes represented schematically in FIG. 12, set 1. The electrodes were separated by calcium zirconate as the dielectric and the PDC had a size of 3.1 cm×5 cm×0.3 cm. The dielectric thickness was chosen based on demonstrated reliability for a 650 VDC rated BME COG MLCC. Typical MLCC manufacturing processes were used to build up the PDC which contained 110 active layers. FIG. 19 is an image of a CSAM scan showing no evidence of cracks, delamination's or construction related defects. The final capacitance of the PDC was 2.7 µF, yielding a Cap(µF)/Volume (CC) of 0.58 µF/cc.

Figure 17:
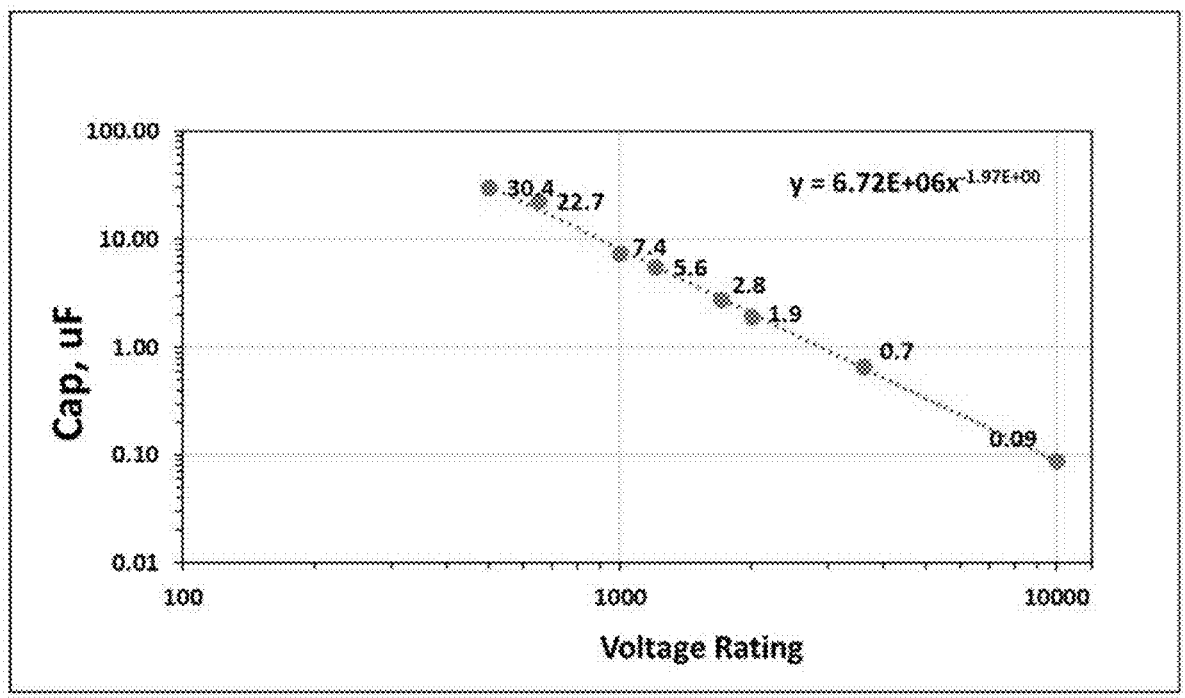
FIGS. 17 and 18 graphically represent embodiments of the invention.
Figure 18:
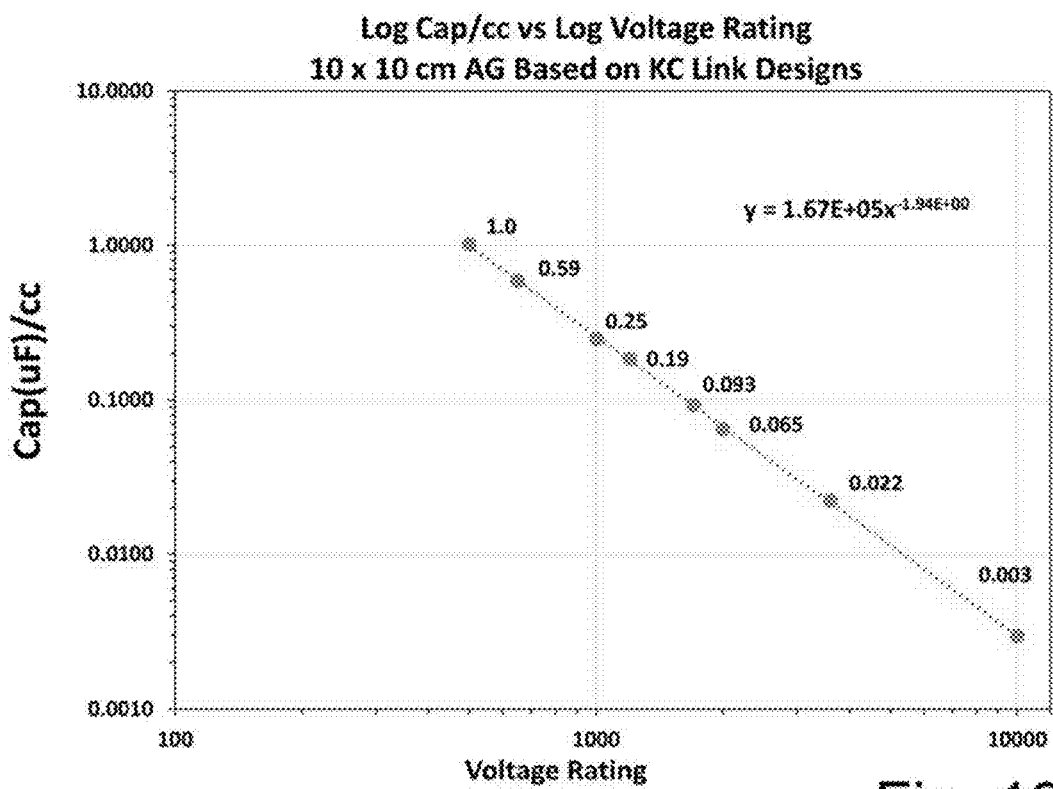

The data presented in FIGS. 17 and 18 illustrate that for 500V to 10,000V it is possible to achieve Cap(µF)/Volume (cc) values of 1.0 to 0.003 for dielectric with a value of K equal to about 32. Applying the same rules for dielectrics with a K of 300 and 10, would be expected to give Cap(µF)/Volume(cc) values of 9.8 to 0.020 and 0.33 to 0.001, respectively.

The invention has been described with reference to the preferred embodiments without limit thereto. One of skill in the art would realize additional embodiments and improvements which are not specifically stated but which are within the meets and bounds of the claims appended hereto.

The invention claimed is:
1. A module for packaging semiconductors comprising:
   at least one PDC comprising parallel internal electrodes of alternating polarity with a paraelectric dielectric between adjacent internal electrodes wherein said paraelectric dielectric has a permittivity above 10 to no more than 300;
   wherein said PDC forms a capacitor couple with at least one semiconductor device; and
   wherein said PDC has a voltage rating of 500V to 10,000V with a capacitance per unit volume of at least 1.0 µF/cc rated at 500V and a capacitance per unit volume of at least 0.003 µF/cc rated 10,000V.
2. The module for packaging semiconductors of claim 1 wherein said PDC is embedded in a structural substrate.
3. The module for packaging semiconductors of claim 2 further comprising at least one capacitive couple termination in electrical contact with alternating internal electrodes.
4. The module for packaging semiconductors of claim 3 wherein said capacitive couple termination comprises at least one metal selected from the group consisting of Cu, Ni, W, Ag, Pd, Pt and Au.
5. The module for packaging semiconductors of claim 3 wherein said capacitive couple termination is selected from an external termination and a via.
6. The module for packaging semiconductors of claim 2 further comprising at least one PDC interface pad.

7. The module for packaging semiconductors of claim 6 wherein said semiconductor device is in electrical contact with said PDC interface pad.

8. The module for packaging semiconductors of claim 7 wherein said PDC interface pad is connected to said semiconductor device by solder balls, solder pillars or wire bonding.

9. The module for packaging semiconductors of claim 2 wherein further comprising internal electrodes encased in said structural substrate.

10. The module for packaging semiconductors of claim 1 wherein said internal electrodes comprise at least one metal selected from the group consisting of Cu, Ni, Al, W, Ag, Pd, Pt and Au.

11. The module for packaging semiconductors of claim 7 wherein said internal electrodes comprises Ni.

12. The module for packaging semiconductors of claim 1 wherein said permittivity is at least 25 to no more than 175.

13. The module for packaging semiconductors of claim 1 wherein said paraelectric dielectric is a C0G dielectric.

14. The module for packaging semiconductors of claim 1 wherein said paraelectric dielectric comprises calcium zirconate.

15. The module for packaging semiconductors of claim 14 wherein said paraelectric dielectric comprises at least 50 wt. % calcium zirconate.

16. The module for packaging semiconductors of claim 1 wherein said PDC has a voltage rating of 1V to 20,000V.

17. The module for packaging semiconductors of claim 1 having a temperature range rated for operation at −65 to 300° C.

18. The module for packaging semiconductors of claim 1 wherein said PDC comprises at least one thermal dissipation channel.

19. The module for packaging semiconductors of claim 18 wherein at least one said thermal dissipation channel selected from parallel to said internal electrodes and perpendicular to said internal electrodes.

20. The module for packaging semiconductors of claim 18 wherein said PDC is between said semiconductor and a cooling device.

21. The module for packaging semiconductors of claim 20 wherein said cooling device is selected from a passive device and an active device.

22. The module for packaging semiconductors of claim 1 further comprising at least one semiconductor device in electrical contact with said PDC.

23. The module for packaging semiconductors of claim 22 wherein said semiconductor device is selected from the group consisting of a transistor, a capacitor, a diode, a resistor, a varistor, an inductor, a fuse, an integrated circuits, an overvoltage discharge device, a sensor, a switch, an electrostatic discharge suppressor, an inverter, a rectifier and a filter.

24. The module for packaging semiconductors of claim 1 wherein said PDC comprises a via.

25. The module for packaging semiconductors of claim 24 wherein at least one internal electrode of said internal electrodes is in electrical contact with an external termination through said via.

26. The module for packaging semiconductors of claim 1 further comprising a thermal dissipation layer.

27. The module for packaging semiconductors of claim 26 wherein said thermal dissipation layer is between said PDC and said semiconductor.

28. The module for packaging semiconductors of claim 27 further comprising at least one via through said thermal dissipation layer.

29. The module for packaging semiconductors of claim 28 wherein said via is an insulated via.

30. The module for packaging semiconductors of claim 27 wherein said thermal dissipation layer has a lower dielectric constant than the paraelectric dielectric.

31. A power supply comprising the module of claim 1.

32. A module for packaging semiconductors comprising:
at least one PDC comprising parallel internal electrodes of alternating polarity with a paraelectric dielectric between adjacent internal electrodes wherein said paraelectric dielectric has a permittivity above 10 to no more than 300;
wherein said PDC forms a capacitor couple with at least one semiconductor device; with said module having a peak operational temperature in a range from 150 to 300° C.

33. The module for packaging semiconductors of claim 32 wherein said PDC has a voltage rating of 500V to 10,000V with a capacitance per unit volume of at least 1.0 μF/cc rated at 500V and a capacitance per unit volume of at least 0.003 μF/cc rated 10,000V.

* * * * *

UNITED STATES PATENT AND TRADEMARK OFFICE
CERTIFICATE OF CORRECTION

| | |
|---|---|
| PATENT NO. | : 10,950,688 B2 |
| APPLICATION NO. | : 16/531255 |
| DATED | : March 16, 2021 |
| INVENTOR(S) | : John Bultitude et al. |

It is certified that error appears in the above-identified patent and that said Letters Patent is hereby corrected as shown below:

In the Drawings

Please delete and replace Fig. 18 as shown on the attached drawing sheet

Signed and Sealed this
Seventh Day of May, 2024

*Katherine Kelly Vidal*

Katherine Kelly Vidal
*Director of the United States Patent and Trademark Office*